United States Patent [19]

Gerhart et al.

[11] Patent Number: 4,724,425

[45] Date of Patent: Feb. 9, 1988

[54] SECURITY AND ALARM SYSTEM

[76] Inventors: Roland T. Gerhart, 4000 Grondinwood La., Milford, Mich. 48042; J. Carroll Hill, 134 Rosswood Dr., PeWee Valley, Ky. 40056

[21] Appl. No.: 756,475

[22] Filed: Jul. 18, 1985

[51] Int. Cl.[4] ........................ G08B 13/00; H04Q 7/00; H03K 9/08

[52] U.S. Cl. .................................... 340/539; 340/501; 340/531; 340/534; 340/345; 340/349; 375/22; 329/104; 329/106; 328/111; 307/234

[58] Field of Search ............... 340/539, 506, 501, 531, 340/534, 345, 349, 350, 354, 588, 589, 696, 825.06, 825.04, 825.36, 825.44, 825.57, 825.63, 825.64; 375/22, 82; 329/104, 106, 126, 128; 328/111, 112, 140; 307/234, 510, 516

[56]. References Cited

U.S. PATENT DOCUMENTS

| | | | |
|---|---|---|---|
| 3,593,138 | 7/1971 | Dunn . | |
| 3,848,231 | 11/1974 | Wootten | 340/539 |
| 3,938,144 | 2/1976 | Pederson et al. | 375/117 |
| 3,961,137 | 6/1976 | Hutt et al. | 375/117 |
| 4,101,872 | 7/1978 | Pappas | 340/539 |
| 4,112,317 | 9/1978 | Everswick | 307/234 |
| 4,162,449 | 7/1979 | Bouyssounouse et al. | 340/539 |
| 4,240,077 | 12/1980 | Hughes et al. | 340/501 |
| 4,247,823 | 1/1981 | Vun Kannon, Jr. | 307/234 |
| 4,273,961 | 6/1981 | Blank et al. | 340/514 |
| 4,308,911 | 1/1982 | Mandl | 340/501 |
| 4,455,551 | 6/1984 | Lemelson | 340/534 |
| 4,464,653 | 8/1984 | Winner | 340/501 |
| 4,465,904 | 8/1984 | Gottsegen et al. | 340/518 |
| 4,512,026 | 4/1985 | Vander Meiden | 375/114 |
| 4,535,297 | 8/1985 | Puckette | 329/126 |
| 4,589,081 | 5/1986 | Massa et al. | 340/501 |
| 4,594,580 | 6/1986 | Nelson | 340/501 |
| 4,596,981 | 6/1986 | Ueno | 340/825.2 |

FOREIGN PATENT DOCUMENTS 2013010 5/1982 United Kingdom .

*Primary Examiner*—Donnie L. Crosland
*Attorney, Agent, or Firm*—Flynn, Thiel, Boutell, & Tanis

[57] ABSTRACT

A method and apparatus are provided for transmitting from a radio transmitter which is part of a first system to a radio receiver which is part of a second system a message which includes a plurality of characters arranged in a predetermined sequence. Each character of the message is transmitted in the form of a 48-bit binary word, the first byte of the word being a start byte, the second and third bytes being identical binary numbers representing the position in the message of a selected one of the characters, the fourth and fifth bytes being identical binary numbers which are the ASCII code corresponding to the selected character, and the sixth byte being a stop byte which is a predetermined binary number different from the start byte.

22 Claims, 15 Drawing Figures

SECURITY AND ALARM SYSTEM

FIELD OF THE INVENTION

This invention relates to a security and alarm system and, more particularly, to a security and alarm system capable of detecting a variety of hazardous situations that might reasonably occur in a home or industrial property, such as theft, fire, heart attack, and the like, capable of signaling the occurrence of such conditions to other parties, and utilizing a sophisticated coding scheme for reliably transmitting an indication of the alarm condition over noisy communications channels, such as those available on citizens band radios.

BACKGROUND OF THE INVENTION

Home security systems of various types have previously been developed. These systems use one or more sensors to detect one or more alarm conditions, such as an intruder, a fire, a drop in temperature due to a furnace failure, and so forth. These prior systems typically actuate an audible alarm, the purpose of which is to scare away any intruder, warn all persons present of the alarm condition, and to warn other persons in the immediate vicinity of the alarm condition. However, if there is no one in the building and if persons in the immediate vicinity do not hear and respond to the alarm, the system is rendered ineffective. For this reason, some prior systems have also been provided with a device which, when triggered, will automatically dial the police or a security service, but an intruder can defeat these systems by cutting the telephone lines to the building prior to entering the building. One approach to overcoming these problems, in particular with respect to making neighbors or other persons in the vicinity aware of an alarm condition, is to provide a system which can communicate with other systems in nearby buildings using radio waves, for example over citizens band channels, since citizens band transceivers are readily available at relatively low cost.

The Federal Communications Commission (FCC) has set aside 40 channels for citizens band radios, of which 6 can be used for coded signals such as radio control applications. Since the FCC made these channels available to the general public without examination requirements, there has been a great interest in using these channels for control and signaling purposes ranging from simple transmitter identification schemes to rather complex systems like those used for the remote control of model airplanes, boats, and cars. As a simple example, a person might like to avoid hearing the continual verbal chatter that is normally present on the typical citizens band channel by having a device connected to his receiver that would only permit an audio output when his receiver receives a unique signal transmitted specifically to him, for example by his neighbor or his spouse. The receiving station, although continually receiving radio signals generated by the transmitting station of interest and also all other citizens band stations within range, would thus produce an audible output only when another transmitting station emitted the requisite unique signal. The person at the receiving end would then be called upon to listen to the extremely noisy conditions that prevail on the usual citizens band channel only when the person at the transmitting end was trying to reach him, rather than continuously.

Although such arrangements are easy to imagine, the situation is quite different in practice, because of a number of legal and physical restrictions imposed on citizens band systems.

First, unlimited Radio Frequency power is not available, because the Federal Communication Commission limits the RF power of a citizens band transceiver to 4 watts (except on one channel 23, which can be used with up to 25 watts). With simple antennas, this restricts the range of such systems to approximately five miles.

Second, the Federal Communications Commission forbids internal adjustment and modification of citizens band transceivers except by holders of the appropriate class of FCC license, and restricts rather severely the adjustments and modifications even those persons may make. In particular, modifications to increase power output and/or to change the modulation techniques are illegal. Consequently, a security and alarm system using citizens band transceivers would have to inject signals into an unmodified citizens band transceiver in the normal way, namely through the microphone input, and since citizens band transceivers are designed to accept voice signals in the audio range, the injected signals would have to be in that range of frequencies, for example from 300 Hz to 3000 Hz.

Third, the above-mentioned restrictions on internal modifications to citizens band devices would also limit the security and alarm system to observing the audio output of the receiver, which may not reproduce the waveform of a transmitted signal with great accuracy. In fact, only sinusoidal signals may be counted on to come through with a reasonably faithful degree of reproduction, due to the narrow audio bandwidth of the transceiver.

Fourth, the citizens band channels are continually filled with other interfering signals which are in themselves legal, since they originate from other licensed stations transmitting voice signals. Since these other transmitters are often mobile stations, the signals received are often very strong. Attempting to receive information from a station five miles away while a transmitter fifty feet away is transmitting is a challenging task, because the strong signals from the nearby transmitter will typically capture the automatic gain control loop of the receiver and thus suppress the signal from the remote transmitter.

These interfering signals can in a sense be referred to as "noise", and one might think that their effects can be readily overcome, because noise suppression and filtering techniques are highly developed and are widely used in the scientific, engineering, and radio communications field. However, the "noise" on the citizens band channels is quite different from the noise that communications technology can suppress, in that it is highly variable in intensity and spectral content with respect to time. That is, the citizens band "noise" is "nonstationary", whereas "stationary" noise has statistical properties such as amplitude distribution and power spectral density that do not change with time. Accordingly, it is far more accurate to think of the interfering signals as "jamming" signals which are highly variable in amplitude, frequency, and pattern of occurrence.

One approach to solving these problems is to start with a simple audio oscillator generating a precisely known frequency in the audio range, for example 1 KHz. This signal is in the passband of the typical citizens band transceiver, and will be transmitted as though it were a normal voice signal. At the receiving end, the 1 KHz signal will be received (if the interfering signals are sufficiently weak), and may be passed through a filter designed to pass only a narrow range of frequencies centered on 1 KHz. The output of this filter will be large only if a 1 KHz signal is being received, and could be taken as an indication that the transmitting station of interest was transmitting. A relay could then be closed, allowing the audio output of the receiver to reach an external loudspeaker or other form of audible alarm, thus enabling the person at the receiving end to hear what was being transmitted.

Many such simple systems have been designed and marketed. They do not work well, however, for the simple reason that normal speech patterns contain substantial amounts of energy in the frequency range surrounding 1 KHz, and this energy causes the narrow band filter to frequently respond to voice signals in exactly the same way that it would respond to the enabling signal from the transmitting station of interest.

An approach to improving the situation would be to pick a better frequency or use narrower filter bandwidths. Because of the restricted bandwidth of the CB transceiver, however, there aren't any frequencies significantly better, and as the receiving filter bandwidth is made narrower, it becomes technologically difficult to make sure that the transmitter and receiver are aligned to the same audio frequency.

Another approach is to use combinations of two or more frequencies transmitted simultaneously or sequentially in an attempt to make the triggering signal sufficiently different from voice signals so that the receiver may reliably tell the two apart. Many attempts have been made in this direction, but none have produced entirely satisfactory results. The problem of reducing the probability of a false alarm to sufficiently low levels while keeping the probability of detecting a true alarm sufficiently high for the system to fulfill its intended purpose is thus difficult. Utilizing relatively simple electronics, it is very hard to generate signals significantly different from those appearing as normal background chatter on the citizens band channels; female voices are particularly likely to trigger such devices with great regularity, due to their strong high frequency content.

SUMMARY OF THE INVENTION

The objects and purposes of the invention are met by providing a method and apparatus for transmitting from a radio transmitter to a radio receiver a message which includes a plurality of characters arranged in a predetermined sequence. Each character of the message is transmitted in the form of a 48-bit binary word, which is made up of six 8-bit binary words. The first 8-bit binary word is a predetermined binary number, the second and third 8-bit binary words are identical and are a binary number representing the position in the message of a selected one of the characters, the fourth and fifth 8-bit binary words are identical and are a binary number representing the selected character, and the sixth 8-bit binary word is a predetermined binary number different from that of the first 8-bit binary word.

In a preferred form of the invention, the bits of the first 8-bit binary word are all binary 0's, and the bits of the sixth 8-bit binary word are all binary 1's. The binary number representing the selected character is the ASCII code representing the selected character. The characters of the message are preferably sent successively and the message is preferably sent repeatedly, so that in effect the transmitter is transmitting a continuous string of binary bits at a first rate. The receiver continuously accepts binary bits at a rate slightly different than the rate at which the transmitter transmits, and the receiver continuously evaluates the 48 bits most recently received in order to determine whether the bit pattern thereof corresponds to a valid transmission.

A system embodying the present invention can provide security from theft, fire, and personal injury to the occupants of a dwelling, an industrial building, or other semi-enclosed space. The system can signal the presence of alarm conditions to nearby neighbors via a radio link utilizing readily available and inexpensive citizens band transceivers. With suitable battery back-up capability installed, the system can maintain communication with neighboring systems even if all telephone and power lines to the protected building have been severed. Use of citizens band channels gives the system a range of approximately five miles, which is sufficient to supply adequate private protection to an entire residential subdivision. In the event of an unlawful entry into someone's home, the intrusion can be detected and signaled to all other surrounding systems, with the effect that all of the person's neighbors having similar systems can be alerted to the fact that the intrusion is taking place, advised where it is taking place, and given pertinent information such as police and fire department telephone numbers and other, information that the homeowner may choose to transmit. The alerted neighbors can then take appropriate action, whether it be to call the police, arouse the homeowner, or turn on their lights and observe so that they may be witnesses.

Signaling between the various systems of the network is by means of the complex coded signal described above, so devised as to be reliably distinguishable from the voice signals that are normally present on any citizens band channel by a pattern checking arrangement. The coded signals are sufficiently complex so that only the complex coded signals generated by the device at the transmitting end are recognized by the device at the receiving end as a valid message indicating the existence of an alarm condition. The false alarm probability of the system is thus extremely low, and experimental results suggest that it is substantially zero. The system embodying the invention has never been observed to trigger on voice signals.

Although special purpose hardware to do the generation and analysis of the coded signals can readily be designed, it is relatively expensive to manufacture. Generation and analysis of the coded signals is thus preferably carried out by a digital computer, namely, a computer of the type commonly referred to as a home computer or a personal computer. The computer can also be used to implement a number of other useful functions without a significant increase in system cost. Furthermore, the computer can still be used for its more ordinary functions, such as game playing, budget analysis, or technical computations, so that purchase of the system actually provides more possible functions than just security.

Also, since most computers of this type are equipped with some form of cathode ray tube which serves as a video display, are equipped with the ability to display textual information in alphanumeric form, and typically have rather extensive graphics capabilities, the alarm system according to the invention can provide a much more informative and useful display than is commonly provided in conventional systems.

When the system is first installed, the user enters data into the computer, such as his or her name, address, telephone number, doctor's telephone number, etc., and this data is transmitted to neighboring systems in the event that an alarm situation is detected. In the event of an alarm, this data is received by all nearby security systems of the same type, and is displayed on the video display of each. Thus, all one's neighbors are immediately informed of the fact that there is an alarm condition, are advised where it is located, and are provided with a displayed list of telephone numbers and other data to allow them to take appropriate action immediately, based on the type of alarm that occurred. In addition, alarm conditions may also cause the system to set off audible alarms at the host installation to inform or awake the occupants and scare away intruders.

The system according to the invention has several advantages over existing systems. The number of sensors it is capable of scanning is much greater than that normally provided, even on large industrial systems, and allows a much higher degree of instrumentation of the home environment than has been previously practical. For example, all doors and windows in a typical dwelling may be monitored. The sensors are scanned at a much faster rate than in prior systems, reducing the possibility that an unauthorized intrusion may go unnoticed and reducing the delay between a sensor status change and its detection by the system. Operation of the system cannot be aborted by cutting telephone lines, because alarms are transmitted to neighboring systems primarily by radio signals, although a telephone dialing capability can be provided. The amount of information provided at neighboring installations in the event of an alarm condition is far greater than in prior systems, allowing far greater flexibility of response on the part of neighbors and other persons in the vicinity. It is not necessary to contract with a telephone answering service or an alarm company, because neighbors fill that role on a mutually cooperative basis. Also, it is not possible to tell from outside the protected building that such a system is installed, although one might choose to advertise the fact. The only external indication of the system's existence is the ubiquitous citizens band antenna, which may be placed in the attic or some other inconspicuous location if concealment is desired. Large antennas are not necessary unless extreme range is desired.

It is quite difficult to deliberately jam the system embodying the invention, especially if there are a number of such systems installed in a given neighborhood. All that is necessary is that the transmission of an alarm indication get through to any one of the many identical systems in the network. Deliberate jamming is particularly difficult to carry out, because the system is technically capable of functioning on any of the citizens band channels, of which there are forty at the present time, and it is unlikely others will be aware of which channel the neighborhood has selected to operate the network on for a particular month, week or day.

The system is inherently frequency agile, and normally produces no radio frequency emissions whatsoever unless an alarm condition occurs. The system achieves satisfactory data transmission despite the presence of voice signals during the frequent lulls or intervals of silence in such signals. The system does not attempt to overpower such voice signals. Instead, system signals garbled by voice signals are ignored by the receiving station, and valid data is again received and displayed when the disturbing voice transmissions temporarily cease. In the extremely unlikely event that voice signals coincident with data transmissions do cause the system to make a mistake and display an erroneous character on the video display, the ability of a human being to comprehend the message even though one or two characters are incorrect will render the error negligible. In any event, the system will typically correct such an error automatically the next time it receives the message, since the message is transmitted repeatedly once an alarm condition occurs.

BRIEF DESCRIPTION OF THE DRAWINGS

A complete understanding of the invention and its features and advantages will become apparent from the following detailed description, taken in conjunction with the accompanying drawings, wherein.

DETAILED DESCRIPTION

For convenience, a brief overview of the system will be given prior to a detailed explanation of the various parts thereof.

Figure 1:
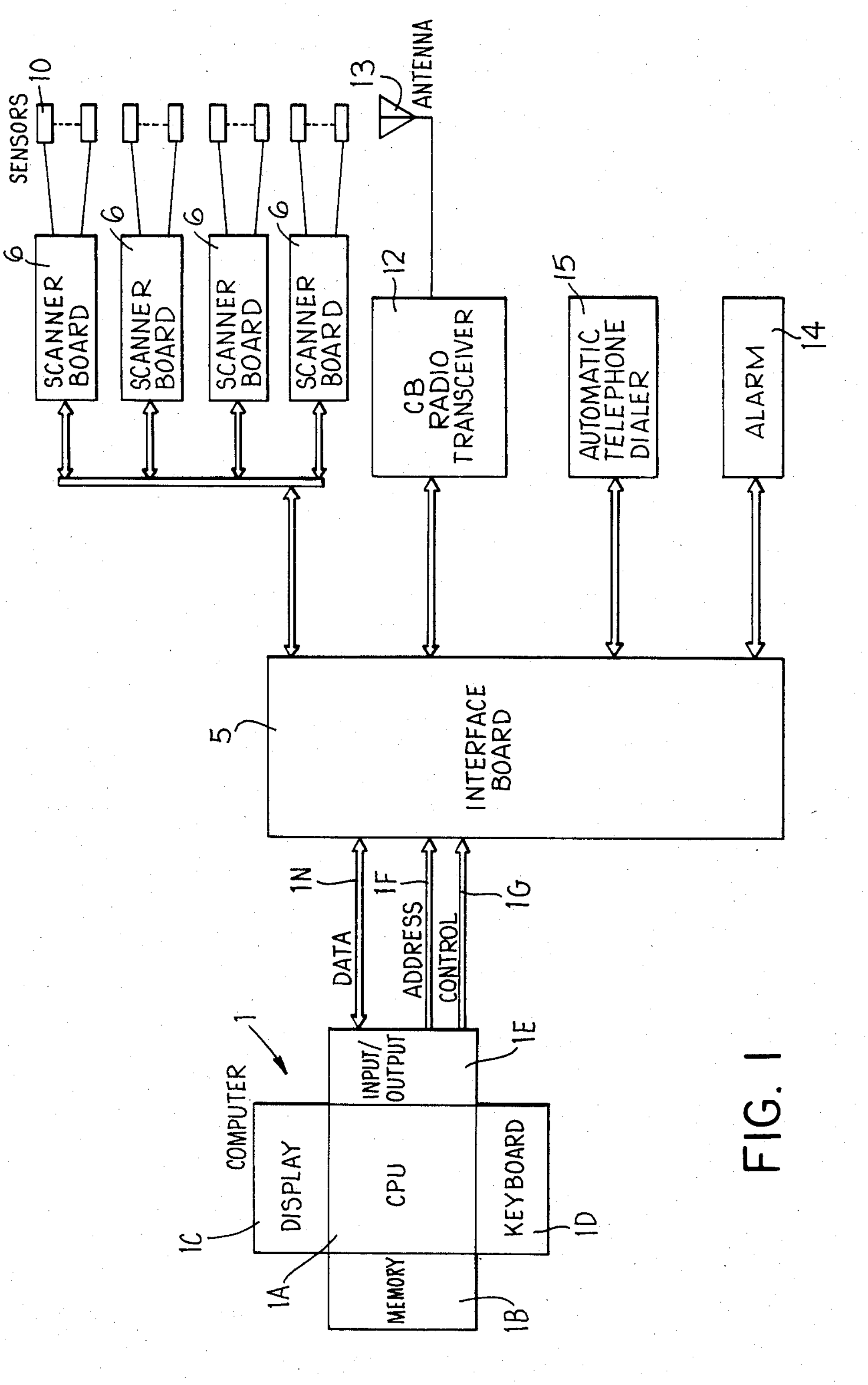
FIG. 1 is a schematic block diagram of a security and alarm system embodying the present invention.

With reference to FIG. 1, there is shown a security and alarm system which includes a computer 1. The computer 1 includes a CPU 1A, memory 1B, video display 1C, keyboard 1D and input/output control 1E. The computer 1 is a conventional, commercially available device and is therefore not described in detail. In the preferred embodiment, the computer 1 is a Radio Shack TRS-80 Model III.

Computer 1 exchanges digital signals with an interface board 5 using address lines 1F, control lines 1G, and a bidirectional data bus 1H. Interface board 5 in turn sends and receives digital signals to and from up to four scanner boards 6, causing the logic circuitry thereon to determine the status of up to 64 sensors 10 for each scanner board 6, for a maximum of 256 sensors. The digital signals sent from the computer 1 through the interface board 5 to the scanner boards 6 select, in a manner described later in detail, which of the 256 possible sensors 10 is being interrogated. Each sensor 10 is a switch, a relay contact or some other device having a pair of contacts which are either open or closed, and after sensing it the associated scanner board sends an electrical signal which is a logic 0 or a logic 1 back to the computer 1 through the interface board 5 to indicate whether the contacts are open or closed. The program in the computer 1 then compares the status of each sensor with its desired status, which is specified by the user when the system is installed. Any discrepancy between the status of a given sensor and its desired status is interpreted by the program as an indication of an alarm condition.

The interface board 5 is also connected to a conventional citizens band (CB) radio transceiver 12, for example a Radio Shack TRC-422A, thereby permitting the security and alarm system to communicate with other identical systems using radio waves. The information signals passed between the interface board 5 and the transceiver 12 are audio frequency analog signals in the 300–3000 Hz range. The transceiver 12 is normally kept in receive mode.

If the security and alarm system has detected an alarm condition via its sensors 10, it will send digital control signals to its radio transceiver 12 in order to place the transceiver 12 into transmit mode. The computer 1 has a table of numbers therein which correspond to various amplitudes at equally spaced intervals along a sinusoidal waveform. This digital data is sent sequentially at a rate proportional to a desired frequency to interface board 5, where it is converted to analog form, filtered, and attenuated to produce a digitally synthesized sinusoid of precise frequency in the 300–3000 Hz frequency range. The frequency of the signal can be changed by changing the rate at which data from the table is transmitted. This audio frequency signal is used as an input signal by transceiver 12. Since transceiver 12 is in the transmit mode, modulated radio frequency emissions will be radiated by antenna 13 and can be received by any other such transceiver within a range of approximately five miles. Other security and alarm systems, which it is assumed are in the receive mode (since the probability of alarm conditions occurring simultaneously at two or more locations is extremely small), will receive the radio frequency emissions produced by the transmitting system. The audio output of the transceiver is filtered and converted into a digital signal by a frequency-to-binary converter circuit on the interface board (which circuit will be described in detail later). This digital signal is passed by the interface board 5 to the computer 1, where it is compared to the type of signal that would be received if alarm data were being transmitted by another system. Normally, no alarm condition is being detected by any such system, and the pattern of 1's and 0's received by the computer will be a random pattern caused by noise or by normal use of the CB channel by other people. In such a case, the pattern of 1's and 0's will not have the specific coding that coded alarm signals generated according to the invention would have. Consequently, the computer 1 simply ignores them. However, when an alarm condition is being signaled by one of the systems, the received patterns will "match" the data pattern expected in the event of an alarm condition and the video display 1C of the computer 1 is then used to display the transmitted message. This message will normally contain the location of the transmitting station, pertinent telephone numbers (e.g., the police), and other such data which the owner of the transmitting station has given it to transmit. Simultaneously, at both the transmitting system and all receiving systems, the computer 1 will cause an interface board 5 to activate one or more audible alarms 14 to alert the occupants of the dwelling in which the alarm condition was detected and the occupants of the dwellings in which the alarm indication is now being received that an alarm condition has been detected. Sufficient information will appear on the displays of the receiving systems to allow anyone receiving an alarm indication to take appropriate action. Such action could be of a variety of forms, depending on the time of day, the type of alarm condition signaled, proximity to the dwelling in which the alarm condition was detected, and other factors. Interface board 5 can also produce an output which activates a conventional automatic telephone dialing device 15, so that the originating system (that is, the one at which the alarm condition was detected) can automatically dial a telephone number of the owner's choice to transmit the alarm condition via telephone lines as well as via the radio link which is the main form of communication.

The system as a whole is powered by a conventional and not illustrated power source, which might be a source of alternating current such as conventional 115 volt, 60 Hz electrical power supply or might be a battery back-up system allowing extended intervals of system operation in the event of a power failure due to natural causes or deliberately introduced by someone seeking unlawful entry.

Figure 2B:
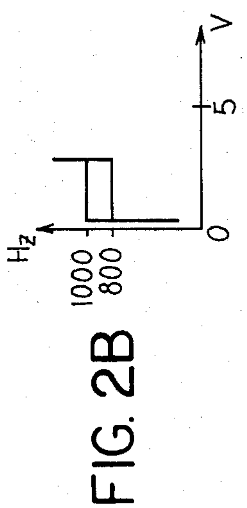
FIGS. 2A and 2B are graphs showing hysteresis characteristics of respective portions of the frequency-to-binary converter circuit of FIG. 2.
Figure 2A:
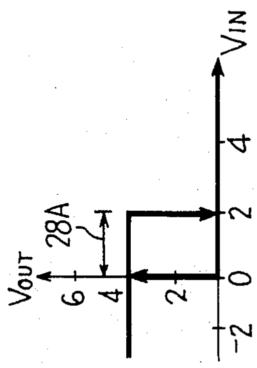
Figure 2:
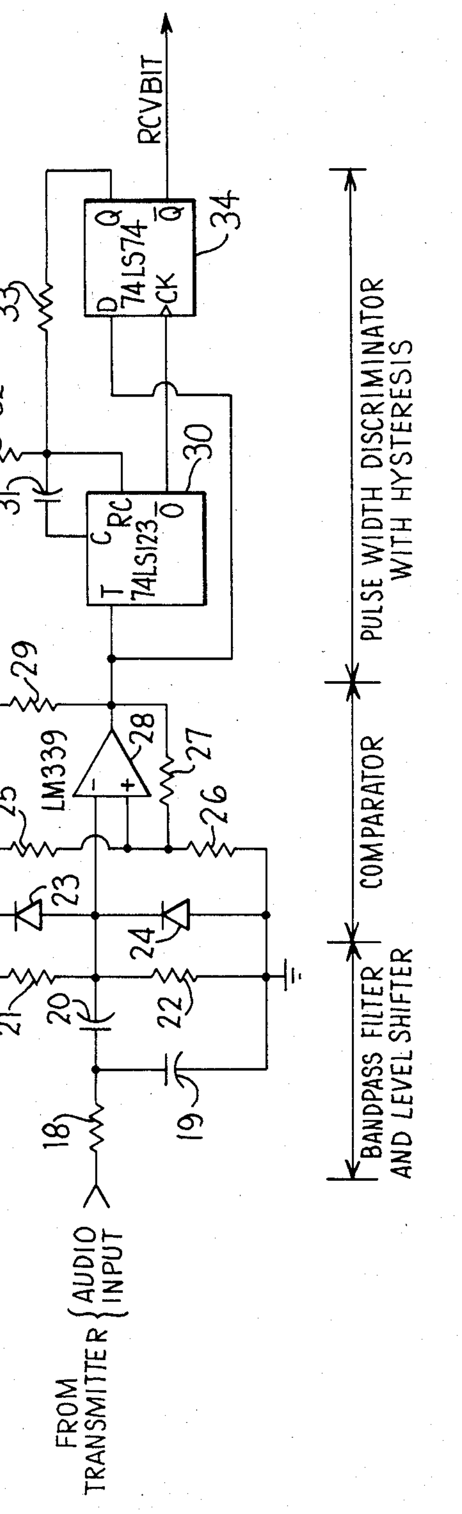
FIG. 2 is a schematic circuit diagram of a frequency-to-binary converter circuit which is a portion of the circuitry of an interface board which is a component of the system of FIG. 1.

Referring now to FIG. 2, there is shown a circuit diagram of a frequency-to-binary converter, which accepts as an input the audio frequency output of the radio transceiver 12 and converts it into a digital signal (1's and 0's) suitable for processing by the computer 1. The audio input is obtained from the speaker output of radio transceiver 12, and is passed through an audio frequency filter consisting of resistors 18, 21 and 22 and capacitors 19 and 20. Resistor 18 and capacitor 19 form a low pass filter whose function is to remove extraneous hiss, static, and other forms of high frequency noise from the audio signal. Capacitor 20 and resistors 21 and 22 form a high pass filter whose function is to remove extraneous low frequency noise (generated largely by speech waveshapes) from the signal. Resistors 21 and 22 also form a voltage divider across the power supply in order to set the proper bias voltage at the inverting input of a comparator 28. Diodes 23 and 24 serve to prevent the input voltage to the inverting input of comparator 28 from going substantially above 5 volts or substantially below ground, since either condition will cause comparator 28 to generate spurious outputs unrelated to its intended function. Resistors 25, 26 and 27 serve two functions simultaneously. First, they set the bias voltage at the non-inverting input of comparator 28 to a level compatible with that set by resistors 21 and 22 at the inverting input. Second, mediated primarily by resistor 27, they provide positive feedback from the output of comparator 28 to its non-inverting input, thus causing the transfer characteristic of comparator 28 and its associated circuitry to exhibit a controlled amount of hysteresis, as shown in FIG. 2A, which causes comparator 28 to discriminate against noisy input signals based on their amplitude (whereas the filters referred to previously discriminate against noisy input signals based on frequency). Resistor 29 is a pull-up resistor for comparator 28, and plays a relatively minor role in the determination of the hysteresis width (at 28A in FIG. 2A) of comparator 28 and the bias level at the non-inverting input of comparator 28. As evident from FIG. 2A, the output of comparator 28 is a digital signal which is approximately 3.5 volts (logical 1) whenever the audio input is positive and is approximately 0 volts (logical 0) whenever the input audio signal is negative. Thus, the main function of the circuitry of FIG. 2, up to the output of comparator 28, is to convert the audio input signal (which may be thought of as a sinusoidal input signal at a given frequency) into a digital signal (a squarewave signal) having the same frequency as the sinusoidal audio input signal. In other words, it is a sine wave to square wave converter, albeit with carefully tailored filtering properties.

The digital output of comparator 28 is fed into the trigger input T of a monostable multivibrator 30 and into the data input D of positive edge-triggered D type flip-flop 34. The width of the output pulse produced at the $\overline{Q}$ output of monostable multivibrator 30 is determined primarily by resistor 32 and capacitor 31, but resistor 33 also plays an important role in determining the width of the output pulse, as described below. The $\overline{Q}$ output of monostable multivibrator 30 is used to clock D flip-flop 34. Ignoring the effect of resistor 33 temporarily, the combination of monostable multivibrator 30, its associated circuitry, and D flip-flop 34 constitute a pulse-width frequency discriminator which produces a digital output signal RCVBIT which is high (logic 1) if the frequency of the incoming square wave from comparator 28 is *greater* than 1000 Hz and is low (logic 0) if the frequency of the incoming square wave from comparator is less than 1000 Hz. Thus, monostable multivibrator 30, D flip-flop 34, and the associated circuitry can detect whether or not the frequency of the square wave out of comparator 28 is above or below a threshold frequency of 1000 Hz. The threshold frequency is, of course, controlled by the width of the output pulse generated by monostable multivibrator 30, which in turn is determined by the values of resistors 32 and 33, capacitor 31, and the output voltage level at the Q output of D flip-flop 34. Since the frequency of the square wave out of comparator 28 is essentially equal to the frequency of the incoming audio signal, RCVBIT is high (logic 1) if the frequency of the incoming audio signal is greater than 1000 Hz, and RCVBIT is low (logic 0) if the frequency of the incoming audio signal is less than 1000 Hz.

The binary digits of the coded transmissions from a system at which an alarm condition has been detected are transmitted serially as digitally synthesized sinusoidal signals where, for example, 1200 Hz represents a binary 1 and 600 Hz represents a binary 0. The overall function of the circuitry of FIG. 2 is to serially reproduce the transmitted pattern of 1's and 0's for subsequent analysis by the computer 1.

Since transitions from 600 Hz to 1200 Hz and back are noisy, spurious outputs from the circuit could result as the input frequency is changed. To avoid this, the pulse-width discriminator which includes monostable multivibrator 30, D flip-flop 34, resistor 32, and capacitor 31 is given a transfer characteristic having a certain amount of hysteresis. FIG. 2B is a graph of the output voltage at RCVBIT as a function of the frequency of the output signal from comparator 28. Resistor 33 produces a small, controlled amount of positive feedback, as follows. If RCVBIT is high, signifying that the input frequency is greater than 1000 Hz, the Q output of D flip-flop 34 is low, and resistors 32 and 33 form a voltage divider across the power supply, thereby lowering the voltage available for charging capacitor 31. This increases the pulse width of the monostable multivibrator 30 and thus lowers the threshold frequency of the pulse-width discriminator to approximately 800 Hz. On the other hand, if RCVBIT is low, signifying that the input frequency is less than the threshold frequency of the pulse width discriminator, the Q output of the D flip-flop will be high, and resistors 32 and 33 will both be connecting capacitor 31 to approximately 4 to 5 volts, so that the capacitor 31 is charged in a manner producing a pulse width for the monostable multivibrator 30 which corresponds to a threshold frequency of 1000 Hz. In effect, resistor 33 causes the pulse-width discriminator to have *two* threshold frequencies, the higher one being in effect if the input frequency is low, and the lower one being in effect if the input frequency is high. This produces hysteresis which discriminates against noise in the input frequency.

The frequency-to-binary converter of FIG. 2, although containing a relatively small number of parts, is thus seen to be to perform a multiplicity of functions, and the careful attention paid to noise reduction in every available way should be apparent. The performance of this circuit is important to the performance of the system as a whole.

Figure 3:
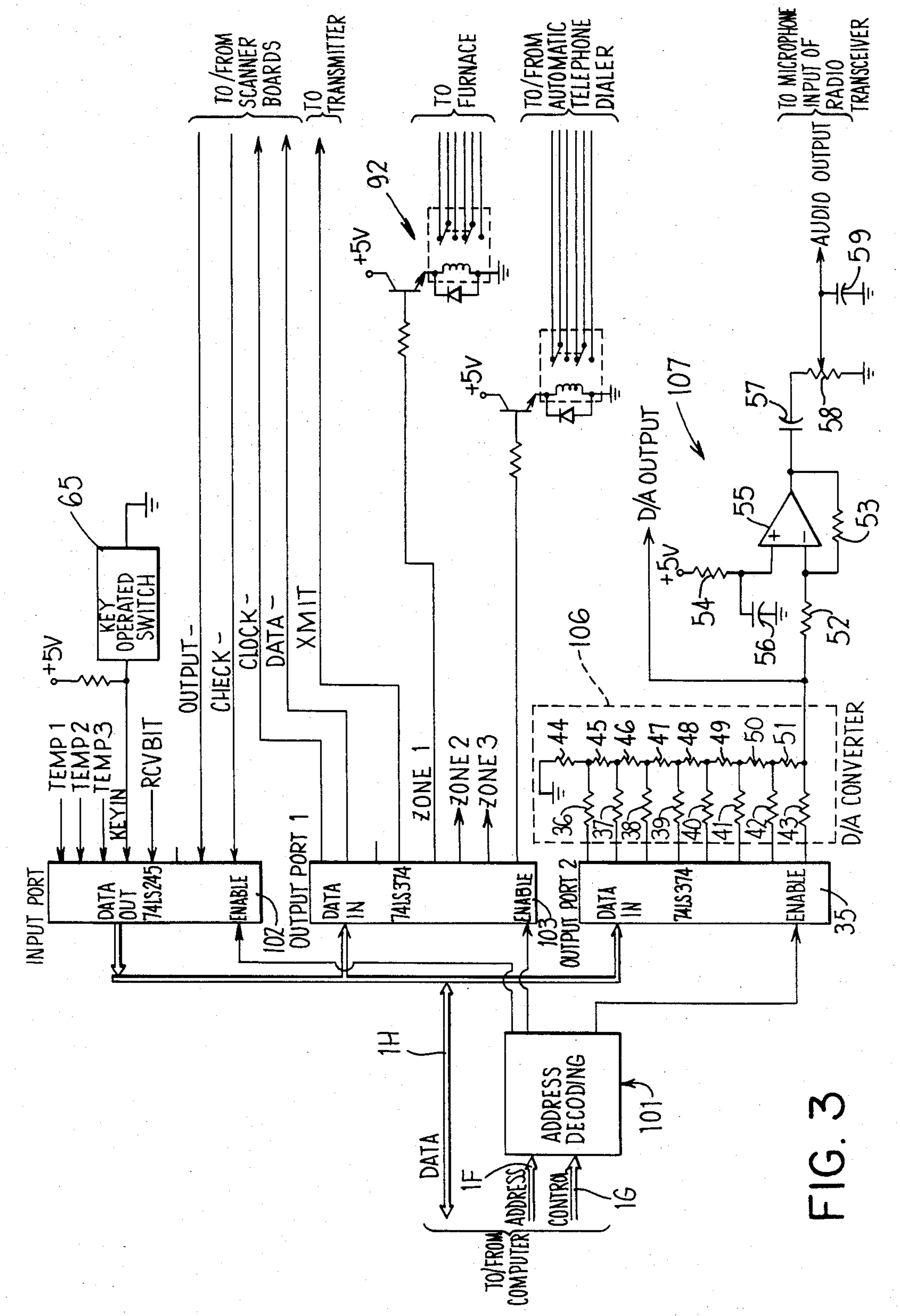
FIG. 3 is a schematic circuit diagram of a further portion of the circuitry of the interface board of FIG. 1, including input and output ports and a digital-to-analog converter circuit.

FIG. 3 is a schematic diagram of a portion of the circuit of the interface board 5 of FIG. 1. The bidirectional data bus 1H from the computer 1 is connected to an octal buffer 102 which serves an input port and to two octal latches 103 and 35 which serve as output ports 1 and 2, respectively. The address and control lines 1F and 1G from the computer 1 are connected to a conventional address decoding circuit 101 which in turn is connected to enable inputs of the buffer 102 and the octal latches 103 and 35. When the address decoding circuit 101 determines that the computer 1 is addressing the input port, it sends an enable signal to the buffer 102 which causes the buffer 102 to place onto the respective lines of the 8-bit data bus the digital signals present at its eight data inputs. Similarly, when the address decoding circuit 101 determines that the computer 1 is addressing one of the latches 103 and 35, it sends an enable signal to the selected latch which causes that latch to be loaded with the data placed on the bidirectional data bus by the computer 1. This information is then available at the data outputs of that latch until the latch is again loaded.

FIG. 3 also shows a digital-to-analog converter 106, together with an output buffer amplifier 107. The digital-to-analog converter 106 includes eight resistors 36–43 and eight resistors 44–51. The resistors 44–51 are connected in series and one end of this serial arrangement is connected to ground, and the resistors 36–43 each connect a respective output of the octal latch 35 to a respective node in the serial arrangement of resistors 44–51. This arrangement is called an R-2R ladder because resistors 36–43 have twice the resistance of resistors 44–51. It is well known that the DC output voltage at the point labeled D/A OUTPUT is proportional to the digital number in the octal latch 35, where the least significant bit of the digital number corresponds to resistor 36 and the most significant bit corresponds to resistor 43. The D/A OUTPUT is a relatively large signal, and this high-level signal is used as an audio input to the transceiver 12 and also as a comparison voltage for analog-to-digital conversion of analog signals from one or more temperature sensors which can be used to detect a low or high temperature alarm condition and can also be used as part of an energy management system. The D/A OUTPUT signal is sent to a buffer amplifier 107 which includes resistors 52, 53, 54 and 55, current-mode operational amplifier 55, and capacitor 56. The output voltage of operational amplifier 55 is connected through a DC blocking capacitor 57 to a potentiometer 58, which permits the amplitude of the AUDIO OUTPUT signal from the buffer amplifier 107 to be adjustably attenuated to the small voltage level necessary for applying it to the microphone input of radio transceiver 12 (FIG. 1). Since the output voltage D/A OUTPUT of the R-2R ladder varies in small steps, capacitor 59 and potentiometer 58 serve as a low pass filter whose cutoff frequency is selected to smooth out the step changes in the digitally synthesized waveform so that they do not get into the microphone input of the transceiver 12.

The low-level AUDIO OUTPUT signal is transmitted by the transceiver 12 when the transceiver 12 is in the transmit mode. The computer 1 feeds digital numbers which are proportional to respective amplitude values at equally spaced intervals along a sinusoid to output latch 35 at a rate suitable to generate one complete cycle every 0.00167 seconds (if a transmitted audio tone frequency of 600 Hz is desired) or every 0.000833 seconds (if a transmitted audio tone frequency of 1200 Hz is desired). The AUDIO OUTPUT signal from potentiometer 58 is the digitally synthesized sinusoid of precisely determined frequency referred to previously. Obviously, the hardware can be used to generate other types of audible (and sub-audible and ultrasonic) signals as well. In particular, digitally synthesized music, alarm tones of any desired pattern of pitch and/or intensity, and digitally synthesized speech signals can also be produced by this circuitry.

Figure 4:
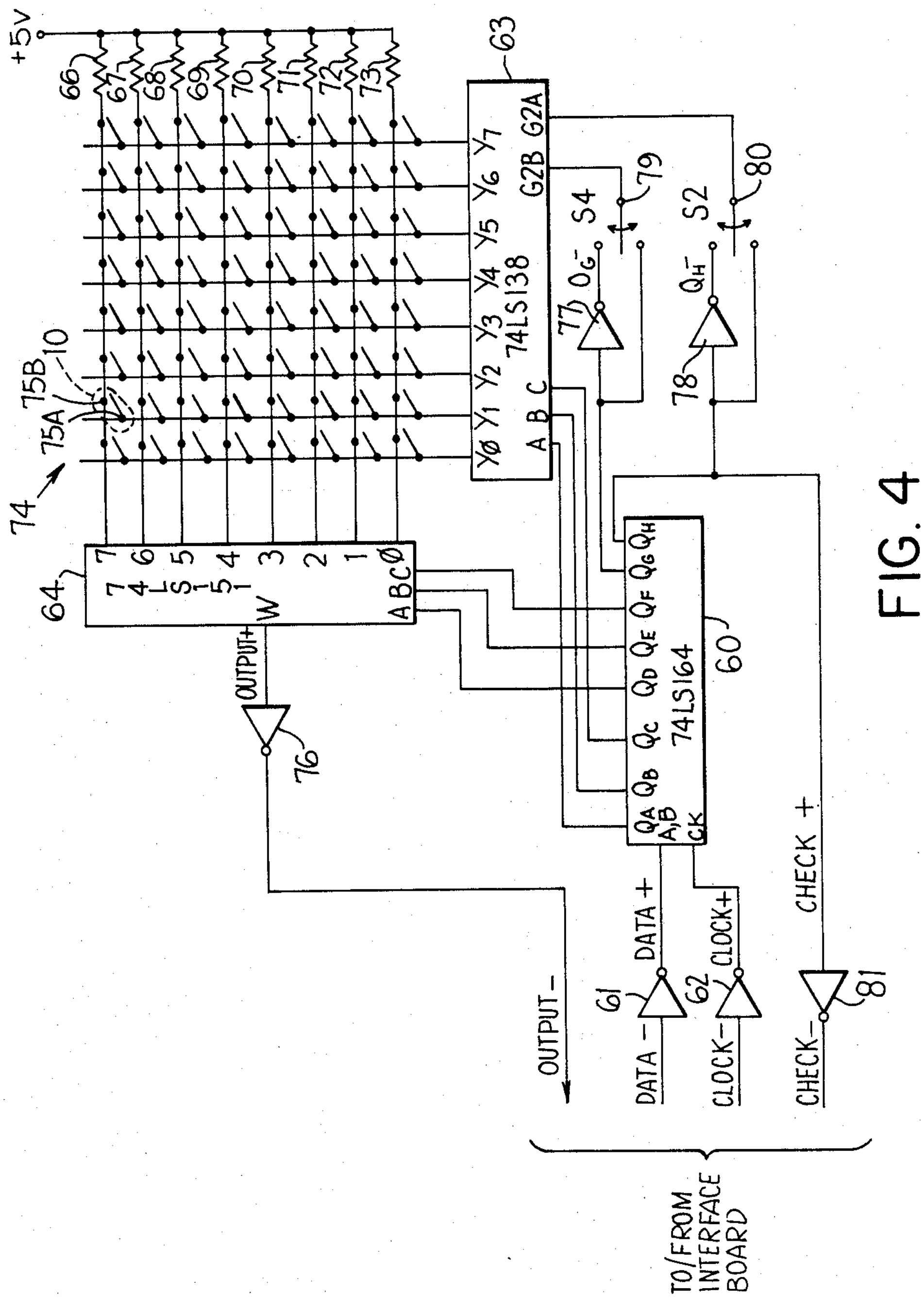
FIG. 4 is a schematic circuit diagram of a scanner board which is a component of the system of FIG. 1.

FIG. 4 shows a sensor scanner circuit which permits the computer 1 to selectively determine the status (contacts open or closed) of any of up to sixty-four of the sensors 10. Through the octal latch 103 (FIG. 3), the computer places a bit (logic 1 or logic 0) on the line in FIG. 4 named DATA−. This signal is inverted by a digital inverter 61, and serves as the serial data input to a shift register 60. Via the octal latch 103, the computer then briefly lowers the line CLOCK−, which is inverted by an inverter 62, thereby clocking the shift register 60, causing all data therein to be shifted and the input data on the line DATA+to be loaded into the first flip-flop of shift register 60. This sequence is repeated eight times in a row, with a different value being output by the computer on the DATA− line each time. In this way, the computer 1 can, under program control, load shift register 60 with any desired 8-bit number. In the disclosed security system, the number is a *sensor address* from 0 to 255. The left-most three bits of the shift register are connected to the select bits A, B, C of a three-to-eight decoder 63, causing the corresponding one of the eight output lines Y0–Y7 to go low (logic 0), while all other output lines of the decoder will remain high (logic 1). The second three bits of the shift register 60 are connected to the select bits A, B, C of an eight-to-one data selector 64, causing the corresponding one of the eight input lines to be transferred through the data selector 64 to its output.

Normally, each data input line of the selector 64 is held high (logic 1) by a corresponding one of eight resistors 66–73 which are each connected to +5 v. However, the contacts of each sensor 10 are respectively connected to a respective row and a respective column of an array 74 of sixteen wires, eight of which are connected to the eight outputs of decoder 63 and eight of which are connected to the eight inputs of data selector 64. There are no direct electrical connections between any of these 16 wires. If the contacts 75A and 75B of a selected sensor 10 are open, the corresponding wires are not connected and the corresponding input line to data selector 64 will remain high (logic 1). On the other hand, if the sensor contacts 75A and 75B are closed, the corresponding output Y1 of decoder 63 will be connected to input 7 of data selector 64 by the engagement of contacts 75A and 75B. Thus, for example, when select inputs A, B, C of decoder 63 have the values 001 (binary 1), Y1 will go low (logic 0), and when select inputs A, B, C of data selector 64 have the values 111 (binary 7), the low output on Y1 will be coupled to input 7 of data selector 64 by the short between contacts 75A and 75B and will appear at the output W of data selector 64. Thus, output W will be high if there is no connection between contacts 75A and 75B, and will be low if there is a connection therebetween. Changes in the state of the sensor contacts 75A and 75B can therefore be detected. Output W is inverted and sent back to the computer 1 as digital signal OUTPUT− via octal input port 102.

Contacts 75A and 75B have been used only as an example in the foregoing discussion. By controlling the bit pattern in shift register 60, the computer 1 can sequentially interrogate all 64 of the sensors 10 and determine if any of the eight horizontal wires have been connected to any of the eight vertical wires.

The last two bits of shift register 60 are connected to switches 79 and 80 so that either $Q_G$ or $Q_G-$ or $Q_H$ or $Q_H-$ may be selected as inputs to the enable inputs G2B and G2A of decoder 63. The eight bits held by shift register 60 are sufficient to address 256 sensors, but the basic scanner circuit of FIG. 4 handles only 64. Setting switches 79 and 80 to any one of their four possible combinations of settings determines which one of the four groups of 64 sensors that are contained in the 256 possibilities will cause a given one of four scanner boards 6 to respond: 0–63, 64–127, 128–191, or 192–255. Four scanner boards 6 having their switches 79 and 80 set to respective positional combinations may thus be used simultaneously in a given system. Consequently, up to 256 different sensors may be handled by the system. All data lines out of the scanner boards, such as OUTPUT− and CHECK− are driven by open collector inverters as at 76 and 81 so that all scanner boards 6 can be connected to the interface board 5 through a common cable. Normally, the computer 1 interrogates the status of each of the sensors 10 in ascending or descending order, but this is merely a programming convenience; the sensor scanner circuit of FIG. 4 allows sensors to be interrogated in any order, including random and/or repeated interrogations of the same sensor for validation purposes if that is desired.

A certain amount of self-diagnostic capability is included in the circuit of FIG. 4. The eighth bit of shift register 60 is fed back as output CHECK− from each scanner board 6 to the computer 1 via open collector inverter 81. As a result, computer 1 can feed known test patterns serially through each shift register 60 and verify that the desired pattern did indeed get into shift register 60. A substantial amount of the more troublesome parts of the system, for example the interconnecting cables, can be at least partially checked this way.

The occupant of the dwelling in which the system is installed must be able to get back into the dwelling without causing the security system to set off an alarm. Accordingly, as shown in FIG. 3, a key-operated switch 65 which is operable from outside the dwelling is connected to an input of the input port 102. The occupant uses a key to deactuate this switch before entering the dwelling. When the normal scanning of the sensors 10 indicates that a change in state of one of these sensors has occurred, namely that one of the doors has been opened as the occupant enters, the system immediately checks to see whether the key-operated switch 65 has been deactuated. If so, no alarm is given. If not, then an alarm is issued.

The occupant must also be able to get out of the dwelling without setting off an alarm. In the preferred embodiment, the occupant pushes a predetermined key on the keyboard 1D (FIG. 1), and the system then gives the occupant about four minutes and 15 seconds to leave the house and close any doors. Alternatively, the system could simply wait until the key switch 65 is reactivated by the occupant after leaving the dwelling.

Figure 5:
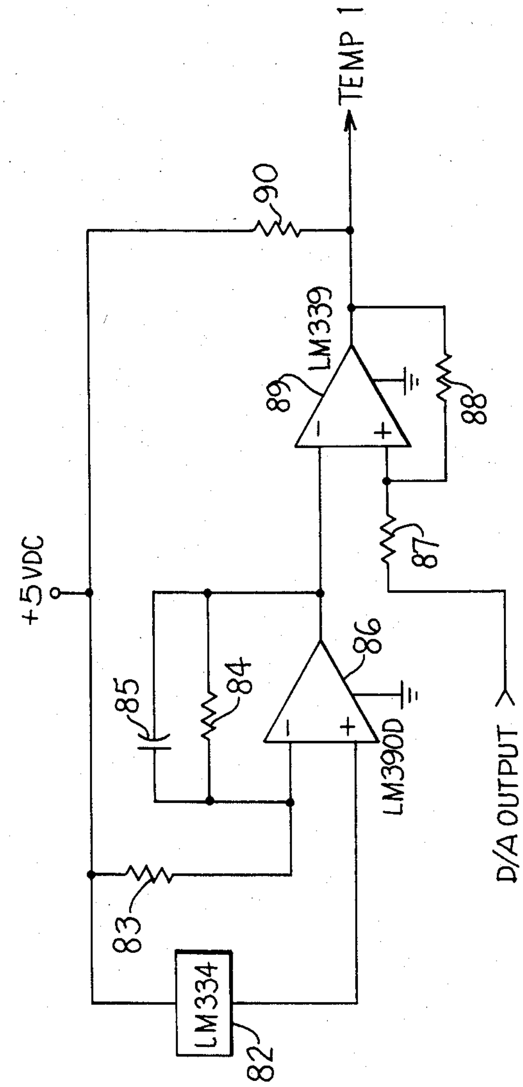
FIG. 5 is a schematic circuit diagram of a temperature sensor and comparator circuit which is a further portion of the interface board of the system of FIG. 1.

FIG. 5 illustrates a further portion of the circuitry on the interface board 5, namely, a temperature sensor and temperature comparator circuit. A basic component of this circuit is a conventional and commercially available device 82 whose output current is proportional to absolute temperature. Resistor 83 supplies an input current to the inverting input of a current mode operational amplifier 86. Operational amplifier 86 and resistor 84 function as a current differencing amplifier, producing an output voltage proportional to temperature on a Centigrade or Fahrenheit scale, rather than on an absolute temperature scale. The linear output voltage range of operational amplifier 86 may thereby be made to occur over a selected temperature range, for example from the freezing point of water to the boiling point of water, rather than from absolute zero to room temperature. Capacitor 85 slows down the response of operational amplifier 86 so that small random variations in instantaneous temperature of the device 82, such as may be caused by wind or convection currents in the air, do not cause significant changes in the output voltage of operational amplifier 86. Operational amplifier 86 thus functions as a low pass filter as well as a differential amplifier. The output voltage of operational amplifier 86 is compared by a comparator circuit, which includes comparator 89 and resistors 87, 88 and 90, with the high level output voltage obtained from the D/A converter 106 (FIG. 3). This voltage is controlled by the computer 1. TEMP1, the output voltage from comparator 89, is fed back to the computer 1 via input port 102 (FIG. 3) on interface board 5, so that the computer 1 can determine whether or not the output voltage of the digital-to-analog converter 106 is less than or greater than the output voltage of operational amplifier 86, and thus determine the temperature at the temperature sensitive device 82. The interface board 5 preferably includes three of the temperature sensing circuits shown in FIG. 5, the output D/A OUTPUT from the digital-to-analog converter being connected to each such circuit and the respective outputs TEMP1, TEMP2 and TEMP3 of these three circuits being connected to respective inputs of the input port 102, as shown in FIG. 3. The temperature sensitive devices 82 can be provided at respective locations in the dwelling which are spaced from interface board 5, and they may thus be used to measure three different indoor temperatures, and if the security and alarm system is connected to the heating plant for the dwelling, a three-zone heating system can be implemented. Alternatively, one of the devices 82 can be used to measure the outdoor temperature. The system architecture is not limited to three temperature sensors; provision of more input ports on the interface board allows the number of temperature sensing circuits to increase to almost any desired degree at relatively low cost. The digital-to-analog circuitry is shared among all temperature sensing circuits, and need not be duplicated.

As shown in FIG. 3, an output ZONE1 of the output port 103 is connected through a resistor and transistor to a relay 92 which can control a furnace capable of supplying heat to the portion of the dwelling in which the temperature sensitive device 82 (FIG. 5) is located. Two additional outputs ZONE2 and ZONE3 are preferably connected through similar relays to two additional furnaces which can respectively supply heat to the portions of the dwelling having the temperature sensitive devices which are connected to the inputs TEMP2 and TEMP3 of input port 102.

The three furnaces are controlled independently in the preferred embodiment, and the manner in which one such furnace is controlled will now be described. The occupant of the dwelling provides the system with data which specifies the desired temperature in the region of the temperature sensitive device 82 at various times during the course of a day. This data is stored in the memory 1B. In order to measure the actual temperature in the region of the temperature sensitive device 82, the system sends to output port 35 (FIG. 3) a digital number which the system estimates to be the actual temperature. This digital number is converted to an analog voltage by the D/A converter 106, and the comparator 89 in FIG. 5 compares this analog signal to an analog signal from the operational amplifier 86 which represents the actual temperature at the temperature sensitive device 82. The result of the comparison is a digital signal (TEMP1) at the output of comparator 89 which is high if the actual temperature is higher than the estimated temperature and low if the actual temperature is lower than the estimated temperature. The system reads the TEMP1 signal through input port 102, and then increments or decrements its temperature estimate, based on the state of TEMP1, in order to bring the temperature estimate closer to the actual temperature. The system repeats this sequence several times, each time using its most recent revision of the estimated temperature, and in due course the estimated temperature will substantially conform to the actual temperature. Using this approach to measure the actual temperature takes longer than would be required if a dedicated analog-to-digital converter were provided to convert the analog output of the temperature sensitive device 82 into a digital number, but the slowness is preferable because it filters out small temporary fluctuations in the output signal from the temperature sensitive device 82, for example those caused by air turbulence, and has the additional advantage of avoiding the cost of a dedicated analog-to-digital converter.

After the system has measured the actual temperature in the manner just described, it locates the temperature which the dwelling occupant has previously specified for the current time of day, and compares this specified temperature to the measured temperature. If the measured temperature is above the specified value, the system deactuates the relay 92 (FIG. 3), which will turn the associated furnace off if it is on and will keep it off if it is already off. On the other hand, if the measured temperature is below the specified temperature, the system actuates the relay 92 in order to cause the associated furnace to supply heat to the region of the temperature sensitive device 82.

The occupant of the dwelling can provide the system with a separate time/temperature profile for each additional temperature sensitive device, and the system independently controls the furnace associated with each such temperature sensitive device in a manner analogous to that just described. Instead of providing separate furnaces, it would alternatively be possible to provide a single furnace and to selectively actuate valves which control fluid flow through conduits which carry heat from the furnace to the region of each of the respective temperature sensitive devices. Further, the system could control one or more air conditioning systems in a manner analogous to that described above for heating systems.

Figure 11:
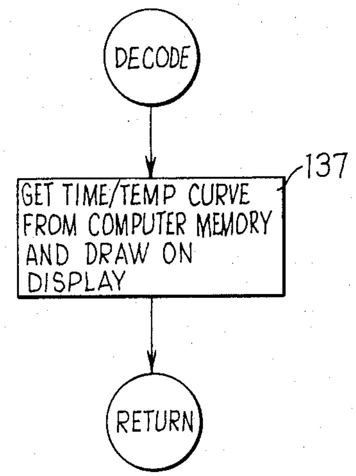
Figure 12:
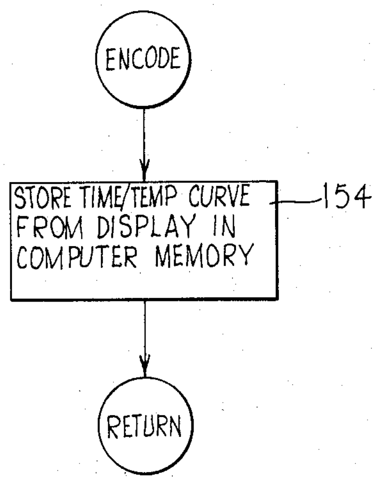
Figure 13:
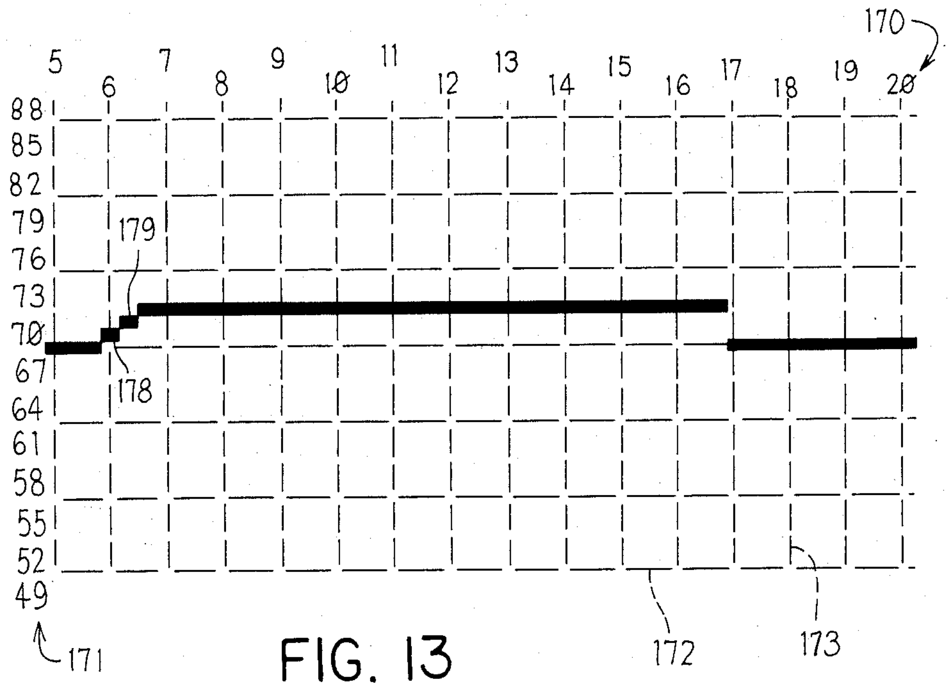
FIG. 13 is a diagrammatic view of an exemplary time/temperature profile as graphically displayed by the system of FIG. 1 on a visual display which is a component thereof.

As mentioned above, the occupant of the dwelling provides the system with a time/temperature profile which specifies the desired temperature in the region of the temperature sensitive device 82 at various times during the course of a day, the time/temperature profile being stored in the memory 1B (FIG. 1). In order to permit the occupant to enter and/or modify the time/temperature profile, the system graphically displays the time/temperature profile as a curve on the video display 1C (FIG. 1), and then permits the user to alter the time/temperature curve, while visually observing it, by pressing certain keys on the keyboard 1B. FIGS. 8–12 depict in flowchart form the software routines which facilitate the graphical display and alteration of the time/temperature profile, and FIG. 13 is a diagrammatic view of an exemplary time/temperature profile as graphically displayed by the system on the video display 1C (FIG. 1).

Figure 8:
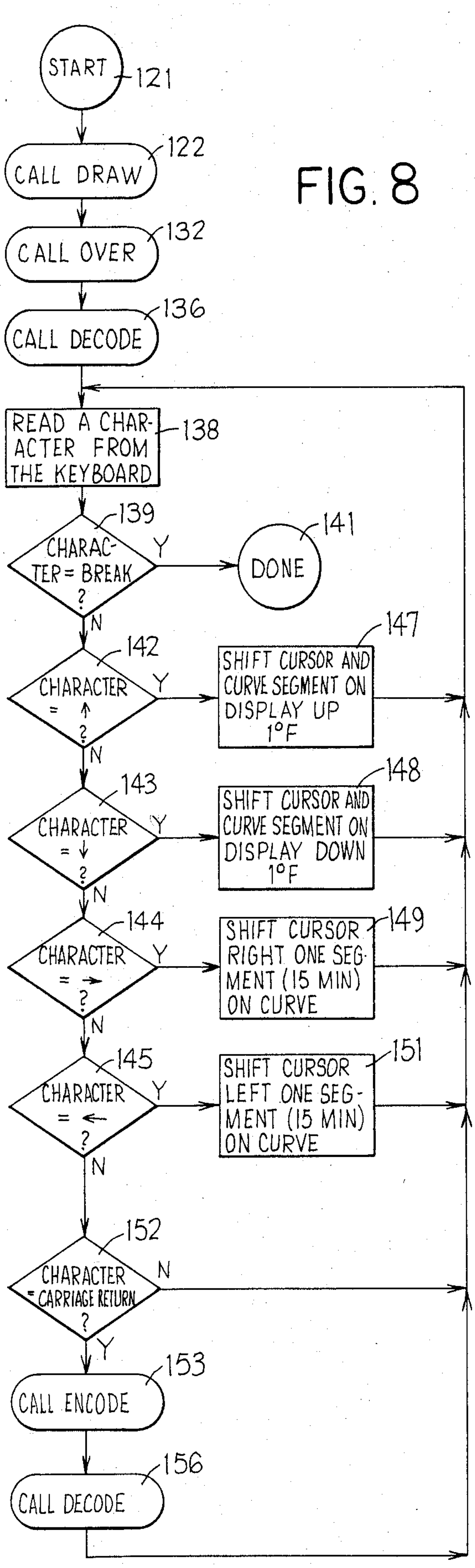
FIGS. 8 through 12 are flowcharts of respective portions of a sequence which is used in the system of FIG. 1 and facilitates graphical entry of a time/temperature profile.
Figure 9:
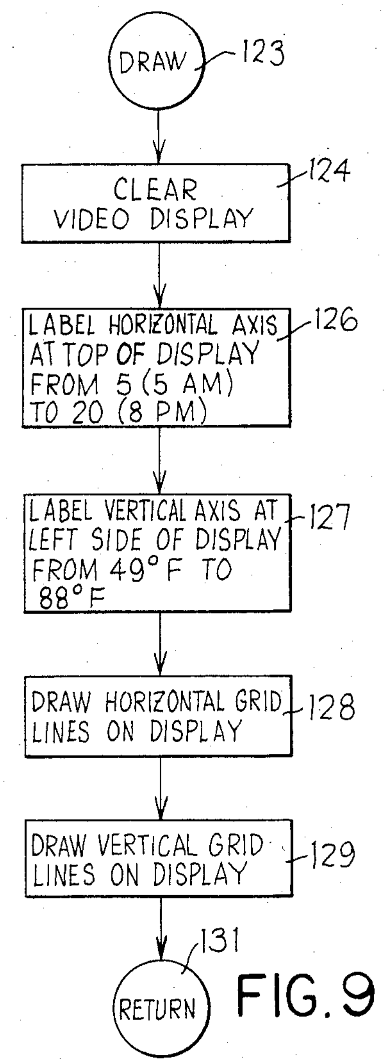

Referring to FIG. 8, when the occupant places the system in a mode for entry of time/temperature data, processing begins at block 121 and proceeds to block 122, where subroutine DRAW is called. The subroutine DRAW is responsible for producing on the screen of the video display 1C the framework for the graph, including labels and grid lines. In particular, referring to FIG. 9, processing begins at block 123 and proceeds to block 124, where the display is cleared. Then, in block 126, the horizontal axis representing time is labeled at 170 in hours from 5 (5:00 A.M.) to 20 (8:00 P.M.). Then, in block 127, the vertical axis is labeled at 171 in increments of 3° F. from 49° F. to 88° F. Then, in blocks 128 and 129, a grid of spaced broken horizontal lines 172 and spaced broken vertical lines 173 are drawn on the display. Thereafter, block 131 returns control to the flowchart of FIG. 8 at block 122.

Figure 10:
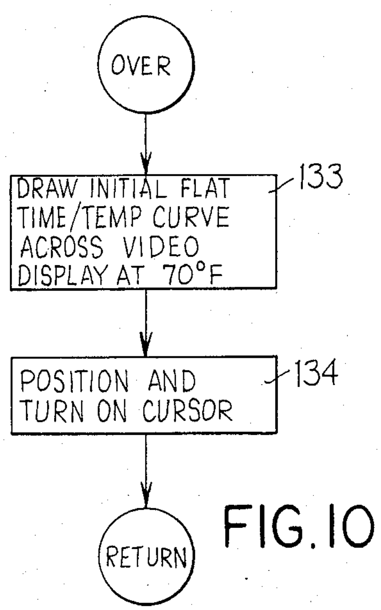

Thereafter, control proceeds to block 132 of FIG. 8, which is a call to the subroutine OVER. The subroutine OVER is shown in FIG. 10, and at block 133 draws an initial flat time/temperature curve horizontally across the display 1C at 70° F. Then, at block 134, the cursor is positioned on the curve at the left end thereof and is turned on, and then control returns to the flowchart of FIG. 8 at block 132.

Control then proceeds to block 136 of FIG. 8, which is a call to the subroutine DECODE. The subroutine DECODE is shown in FIG. 11. The subroutine DECODE gets from the memory 1B (FIG. 1) any time/temperature curve data previously entered by the occupant and displays it on the display 1C in place of corresponding portions of the initial flat curve drawn by the subroutine OVER of FIG. 10. If a complete time/temperature curve has previously been entered, it will replace the entire initial flat curve which was tentatively drawn on the display by the subroutine OVER. An exemplary time/temperature curve is shown at 177 in FIG. 13 and is a series of segments which each represent a time interval of fifteen minutes, two of which are shown at 178 and 179.

The subroutine DECODE returns control to the flowchart of FIG. 8 at block 136, and control proceeds to block 138, where the system waits for the occupant to press a key on the keyboard, and then examines the character received from the keyboard in order to determine which key was pressed. In particular, at block 139, the character from the keyboard is checked to see if the "break" key was pressed to indicate that the occupant is finished entering or changing time and temperature data. If so, processing of time and temperature data is terminated at block 141. If not, then in blocks 142–145 the system successively checks to see if the key pressed was one of the four keys which respectively indicate that the cursor is to be moved up, down, right or left on the that the cusor is to be moved up, down, right or left on the screen. If it is determined in block 142 that the cursor is to be moved up, then at block 147 the cursor and the fifteen minute curve segment on which it is positioned are shifted upwardly on the display by 1° F. Similarly, if it is determined at block 143 that the cursor is to be moved downwardly, then at block 148 the cursor and the fifteen minute curve segment on which it is positioned are moved downwardly by 1° F. on the display. If it is determined at block 144 that the cursor is to be moved rightwardly, then at block 149 the cursor is shifted right fifteen minutes to the adjacent segment and positioned thereon. Similarly, if it is determined at block 145 that the cursor is to be moved to the left, the cursor is shifted left fifteen minutes to the adjacent curve segment and positioned thereon. Control proceeds from each of the blocks 147, 148, 149 and 151 to the block 138, where the system waits for the occupant to press another key on the keyboard. Thus, by pressing the cursor control keys, the occupant can adjust the time/temperature profile in any desired manner.

When the occupant is satisfied with the displayed time/temperature profile and wants to store it in the memory 1B, he presses a key which causes the keyboard to send the system a "carriage return" character, and in FIG. 8 the system checks for this character at block 152. When this character is received, processing proceeds to block 153 and a call is made to subroutine ENCODE, which is shown in FIG. 12. Referring to block 154 of FIG. 12, the subroutine ENCODE takes the time/temperature curve which the occupant has entered on the display and stores it in the computer memory 1B. Then, control is returned to FIG. 8 at block 153, and proceeds to block 156 where a call is made to subroutine DECODE. As previously described, subroutine DECODE retrieves from the memory 1B the time/temperature curve stored by the subroutine ENCODE, and draws it on the display. Then, control returns to block 138, where the system waits for the occupant to press another key. As already mentioned, when the occupant has finished entering, adjusting and/or storing the time/temperature curve, he presses the "break" key and, at blocks 139 and 141 of FIG. 8, processing of time and temperature data is terminated.

Figure 6:
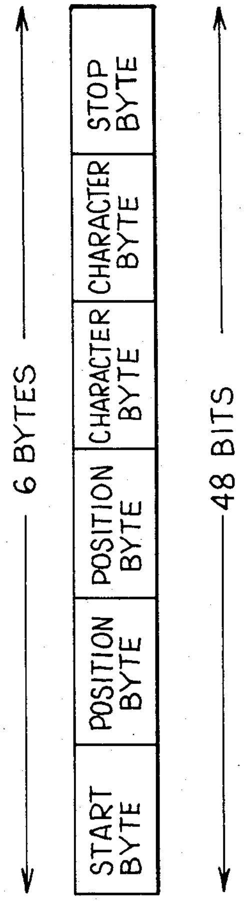
FIG. 6 is a diagram of a coded data format used in inter-system data transfer in the system of FIG. 1.

With respect to the drawing of FIG. 6, there is shown a coded data format according to the invention which is used to transmit data from one system to another. The data to be transmitted is referred to as a message. There are two important characteristics about any message: the characters (letters, numbers, spaces, punctuation marks, etc.) which it includes and the sequence in which the characters occur. Wrong characters obviously constitute a garbled message, but correct characters in erroneous sequence are equally disastrous. The coded format in FIG. 6 is based on a number pair. The first number, in the range of 0–255, is simply the 8-bit ASCII code for a particular character. The character's position within the message is given by the second number. Each message in the system of FIG. 1 can include up to 128 characters. Consequently, 7 bits are required to define the position of a given character, and the number pair is thus a 2-byte quantity. (A byte is 8 bits).

The effects of noise and/or jamming signals can cause a properly transmitted character to be received incorrectly; the character byte may be incorrect, the position byte may be incorrect, or both may be incorrect. All three situations are equally undesirable. Therefore, it is desirable to include some form of verification that a byte received, whether a character byte or a position byte, is indeed correct before it is output to the receiving system's display screen. According to the invention, and as shown in FIG. 6, the position byte is sent twice, and then the character byte is sent twice. Obviously, a greater number of repetitions could be used, reducing the probability of accepting an invalid character/position pair to as low a level as desired.

If a long string of such numbers is transmitted, it is difficult to know where the beginning of the first data byte is. This is referred to as the synchronization problem. In the coded data format in FIG. 6, the two identical position bytes are therefore preceded by a start byte of all binary 0's (00000000) and the two identical data bytes are followed by a stop byte of all binary 1's (11111111). The coded format used to transmit one character is thus six bytes or 48 bits in length: a start byte, two identical bytes for redundant transmission of the character position byte, two identical bytes for redundant transmission of the character itself, and a stop byte. As an example, sending the message "CAT" would require transmission of the following three 48-bit strings:

| |
|---|
| 000000000000000000000000010000110100001111111111 |
| 000000000000000100000001010000010100000111111111 |
| 000000000000001000000010010101000101010011111111 |

The ASCII codes for C, A, and T are C=0100011, A=0100001, and T=01010100, and they are respectively the 0000000, 0000001, and 0000010 characters in the message.

The three 48-bit strings above are repeated below, with spaces inserted between bytes in order to make the example easier to understand:

| START | POSITION | POSI-TION | CHAR | CHAR | STOP |
|---|---|---|---|---|---|
| 00000000 | 00000000 | 00000000 | 01000011 | 01000011 | 11111111 |
| 00000000 | 00000001 | 00000001 | 01000001 | 01000001 | 11111111 |
| 00000000 | 00000010 | 00000010 | 01010100 | 01010100 | 11111111 |

Translated into conventional letters and decimal numbers, this reads:

| | | | | | |
|---|---|---|---|---|---|
| 0 | 0 | 0 | C | C | 255 |
| 0 | 1 | 1 | A | A | 255 |
| 0 | 2 | 2 | T | T | 255 |

A serially received string of 48 bits may or may not represent a valid 6-byte transmission from another security and monitoring system. To be valid:

(a) the first byte must be 00000000;

(b) the sixth byte must be 11111111;

(c) the second and third bytes must be identical;

(d) the common binary value of the second and third bytes must be between 0 and 01111111 (decimal 127);

(e) the fourth and fifth bytes must be identical; and (f) the common binary value of the fourth and fifth bytes must lie between 00100000 (decimal 32) and 01011010 (decimal 90) inclusive, which includes the ASCII codes for all the capital letters, all commonly used punctuation marks, and the decimal digits 0–9.

Figure 7:
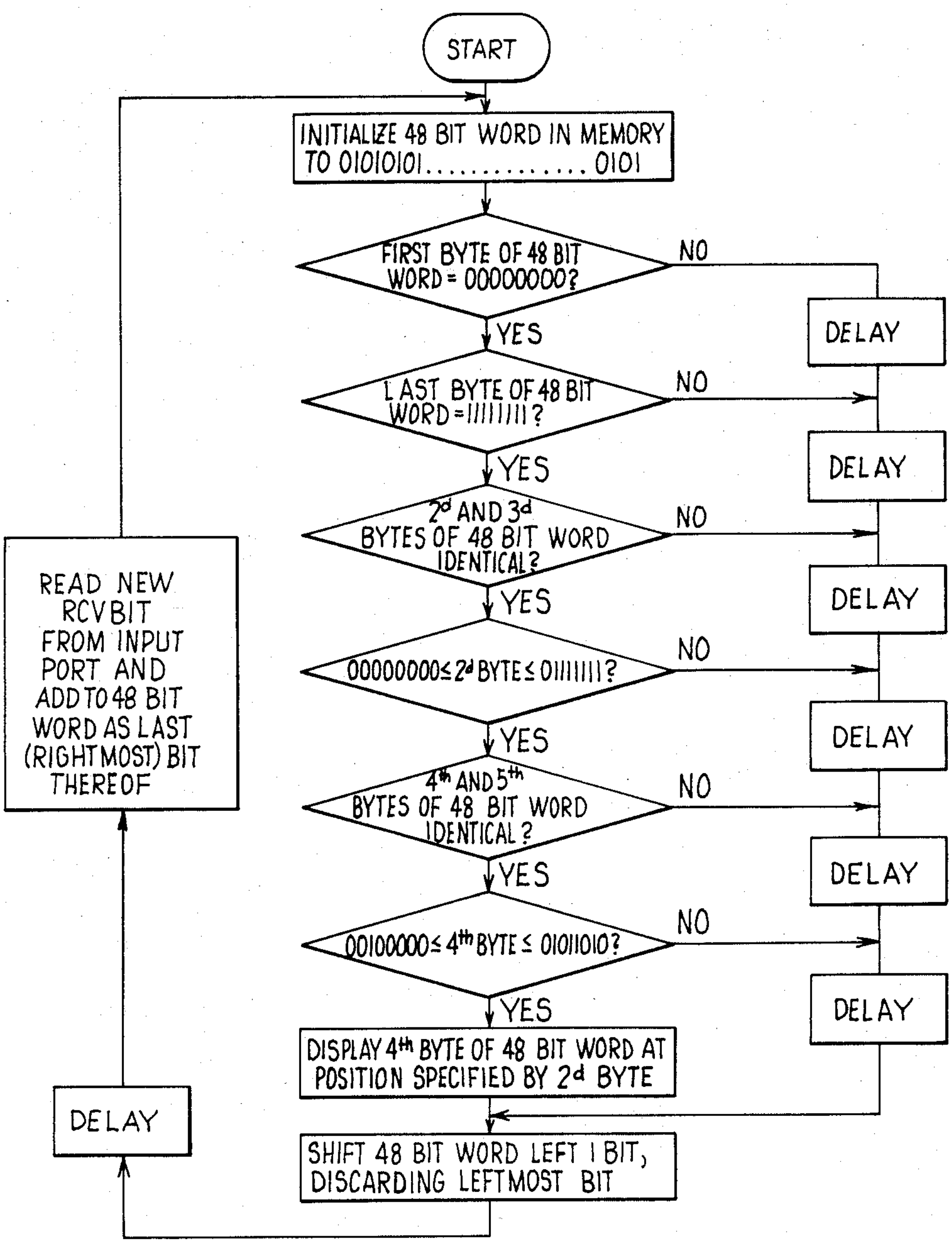
FIG. 7 is a flowchart of a pattern recognition sequence used to analyze received data.

Thus, according to the invention, a serially received 48-bit word is treated as a valid transmission only if several important conditions are met. Special purpose hardware to check these conditions could be designed without difficulty, but they can also be checked quite rapidly by the computer 1 using a suitable sequence of compares and/or subtractions. FIG. 7 is a flowchart of the sequence of steps the computer 1 preferably follows to check these conditions. Assuming that all the tests have been passed and the 48-bit word is indeed valid, the receiving computer 1 will then display the character specified in the second byte at one of 128 positions on its display screen specified by the fourth byte. If, on the other hand, the 48-bit word does not meet all of the requisite conditions, the 48-bit word being analyzed does not represent a valid transmission and it is not displayed. Instead, it is simply ignored.

In either case, whether the data is valid or not, the receiving computer 1 shifts the resulting 48-bit word of FIG. 6 left one bit, discarding the leftmost (oldest) bit, and then reads a new bit from the RCVBIT (FIG. 2) through the input port 102 and adds it to the 48-bit word as the rightmost bit. In essence, a 48-bit shift register is implemented in the memory of the computer 1, and each time a new bit is received the 48-bit word is shifted 1 bit and is then examined in detail again to see if it is a valid transmission from another system. If it is, it is displayed. If it is not, it is ignored.

There is no practical way to achieve absolute synchronization of the transmitting and receiving systems at the bit level. Therefore, it is entirely possible that a receiving system may be sampling received information at precisely the instants in time that the transmitting system is changing the bits it is sending. In such a case, valid data would be received very rarely, if at all. Preferably, the receiving system samples received information halfway between changes made by the transmitting system. In this case, highly accurate and consistent data transmission is normally achieved. If the transmitting and receiving rates are very nearly equal, very long periods of satisfactory reception can occur, but long periods of little or no reception can also occur. This is undesirable. It is therefore preferable that the transmitting and receiving bit rates differ in frequency by an amount so that simultaneous changing and sampling of data bits will occur periodically but for only short periods of time, no greater than the time required to transmit a 128-character message once. The sampling rate of the receiving system can, for example, be adjusted by varying the length of the delays shown in the flowchart of FIG. 7. The system may miss part of one transmission of the message, but it will receive the message correctly the next time it is transmitted.

It might be supposed that the 128 character positions referred to above are sequential positions on the screen of the displaying microcomputer. This need not be the case; in the system described here, the positions can be provided in groups at various locations on the screen. The data entry routines used when the system user enters his personal data into his system assign position numbers to his input characters in such a way that when these position numbers are received and transformed through the inverse function. The received characters are displayed in the same locations on the video display of the receiving system as the locations they were assigned upon entry into the transmitting system. Thus, the display format is substantially the same as the data entry format, allowing each user to exert considerable control over what will appear on the video display of all receiving systems in the event an alarm condition is detected at his location.

The coded data format illustrated in FIG. 6 and described above has been found to be very effective at avoiding false alarms. In the presence of interfering signals, the transmitting system is of course unaware that interference is taking place. It simply repeats the message a number of times. The receiving system receives valid data in the frequent lulls in the interfering signals, such lulls being very common with voice-generated interference, and ignores invalid data produced as a result of the interfering signals. Since position data accompanies and has equal status with the character data, the receiving system does not lose its place in the message. Missing characters are simply filled in and/or corrected on the next transmission of the message. Furthermore, if no station is transmitting valid message data, naturally occurring noise and interference never cause the receiving system to receive and display a valid message. Consequently, the system as a whole has an extremely low probability of false alarms.

Although a particular preferred embodiment of the invention has been disclosed in detail for illustrative purposes, it will be recognized that variations or modifications of the disclosed apparatus, including the rearrangement of parts, lie within the scope of the present invention.

PROGRAM LISTING

The foregoing description of the security and alarm system according to the invention should be sufficient to permit a programmer of ordinary skill to generate the program required for the computer 1 shown in FIG. 1. Nevertheless, in order to ensure that a functional version of the program is readily available, an exemplary version of the program is set forth hereinafter.

```
01000 ;     **********************************************
01020 ;     *     HOME SECURITY SYSTEM VERSION 2.0        *
01040 ;     *         COPYRIGHT (c) 1985                  *
01060 ;     *     JOHN CARROLL HILL                       *
01070 ;     *     134 ROSSWOODS DRIVE                     *
01080 ;     *     PEWEE VALLEY, KENTUCKY   40056          *
01100 ;     *                                             *
01120 ;     **********************************************
01140 ;
01160 ;  SYMBOLIC SYSTEM ADDRESS CONSTANTS FOR MODEL III
01180 RESET    EQU     0000H    ;SYSTEM RESET
01200 KBCHAR   EQU     002BH    ;CHECK FOR KEYBOARD CHARACTER
01220 VDCHAR   EQU     0033H    ;DISPLAY A CHARACTER
01240 PRCHAR   EQU     003BH    ;PRINT A CHARACTER
01260 KBLINE   EQU     0040H    ;WAIT FOR A KEYBOARD LINE
01280 KBWAIT   EQU     0049H    ;WAIT FOR A KEYBOARD CHARACTER
01300 DELYRS   EQU     0060H    ;RS DELAY ROUTINE
01320 VDCLS    EQU     01C9H    ;CLEAR THE SCREEN
01340 VIDEO    EQU     3C00H    ;VIDEO RAM BASE ADDRESS
01360 PRSCN    EQU     01D9H    ;PRINT SCREEN CONTENTS
01380 CSOFF    EQU     01F8H    ;TURN OFF CASSETTE
01400 VDLINE   EQU     021BH    ;DISPLAY A LINE
01420 CSIN     EQU     0235H    ;INPUT A CASSETTE BYTE
01440 CSOUT    EQU     0264H    ;OUTPUT A CASSETTE BYTE
01460 CSHWR    EQU     0287H    ;WRITE THE CASSETTE HEADER
01480 SETCAS   EQU     3042H    ;SET CASSETTEBAUD RATE
01500 KBBRK    EQU     028DH    ;CHECK FOR <BREAK> KEY ONLY
01520 CSHIN    EQU     0296H    ;READ THE CASSETTE HEADER
01540 READY    EQU     1A19H    ;JUMP TO BASIC READY
01560 BRKVECT  EQU     400CH    ;<BREAK> JUMP VECTOR(THREE BYTES)
01580 CAPS     EQU     4019H    ;CAPS LOCK SWITCH- 0=U&L
```

```
CURADD   EQU    4020H     ;CURSOR ADDRESS
CURCHAR  EQU    4023H     ;CURSOR CHARACTER- ASCII 32-255
BAUDRT   EQU    4211H     ;CASSETTE BAUD RATE SWITCH-0=500
EDAS     EQU    5500H     ;EDAS RE-ENTRY POINT
BOXTOP   EQU    VIDEO+448        ;TOP OF DISPLAY BOX
BLINK    EQU    401CH     ;CURSOR BLINK/NO BLINK SWITCH
;*********************************************************
;*    USEFUL ASCII CHARACTERS/DISPLAY CODES              *
;*********************************************************
CR       EQU    0DH       ;CARRIAGE RETURN
LF       EQU    0AH       ;LINE FEED
ETX      EQU    03H       ;END OF TRANSMISSION
BAR      EQU    191       ;VERTICAL BAR
TBLOCK   EQU    131       ;TOP BLOCK
MBLOCK   EQU    140       ;MIDDLE BLOCK
BBLOCK   EQU    176       ;BOTTOM BLOCK (ALSO DEFAULT CURSOR)
DLY      EQU    456
;*********************************************************
;*    DISPLAY MESSAGES                                   *
;*********************************************************
         ORG    0E000H
M1       DEFM   '          IEM HOME SECURITY SYSTEM

         DEFB   ETX
M2       DEFM   '****  MAIN SUBSYSTEM MENU  ****'
         DEFB   ETX
M3       DEFM   'ENTER # OF DESIRED SUBSYSTEM/OPERATION:'
         DEFB   ETX
M4       DEFM   'HOME #'
         DEFB   ETX
M5       DEFM   'WORK #'
         DEFB   ETX
M6       DEFM   'POLICE #'
         DEFB   ETX
M7       DEFM   'FIRE #'
         DEFB   ETX
M8       DEFM   'HOSP #'
         DEFB   ETX
M9       DEFM   'DOCTOR #'
         DEFB   ETX
M11      DEFM   '1.  PERSONAL DATA SUBSYSTEM'
         DEFB   ETX
M12      DEFM   '2.  SECURITY SUBSYSTEM'
         DEFB   ETX
M13      DEFM   '3.  SYSTEM TEST SUBSYSTEM'
         DEFB   ETX
M14      DEFM   '4.  ENERGY MANAGEMENT SUBSYSTEM'
         DEFB   ETX
M15      DEFM   '5.  WRITE PERSONAL DATA TO CASSETTE'
         DEFB   ETX
M16      DEFM   '6.  READ PERSONAL DATA FROM CASSETTE'
         DEFB   ETX
M17      DEFM   '7.  WRITE TEMP. PROFILE TO CASSETTE'
         DEFB   ETX
M18      DEFM   '8.  READ TEMP. PROFILE FROM CASSETTE'
         DEFB   ETX
M19      DEFM   '9.  ACQUIRE CURRENT SENSOR STATUS'
```

```
02720           DEFB    ETX
02740 M20       DEFM    '0.  DISPLAY USER DATA'
02780           DEFB    ETX
02782 M21       DEFM    'A.  EXIT HOUSE'
02784           DEFB    ETX
02800 ;*******************************************************
02820 ;*  START OF EXECUTABLE CODE                            *
02840 ;*        ZZZZZZ IS TRANSFER ADDRESS                    *
02860 ;*******************************************************
02880 ZZZZZZ    CALL    VDCLS    ;CLEAR SCREEN
02900 ;  ENABLE I/O PORTS
02920           LD      A,(4210H)
02940           OR      16
02960           AND     0DFH     ;DISABLE VIDEO WAITS!!!!!!!!!!
02980           LD      (4210H),A
03000           OUT     (0ECH),A
03020 ;  OUTPUT PORTS ENABLED!!!!!!!!!!!
03040 ;  INITIALIZE OUTPUT PORTS:
03060           LD      A,01H    ; RAISE CLK* ON PORT 1
03080           OUT     (01H),A
03100           LD      (OUTP1),A
03120           LD      A,0FFH   ; SET INITIAL D/A TO 255
03140           OUT     (0H),A
03160 ;  OUTPUT PORTS INITIALIZED!!!!
03180           LD      A,0H
03200           LD      (ACCUM),A
03220           LD      (FLAG),A
03240 ;         DISABLE INTERRUPTS!!!!!!!!!!!
03260           DI
03280 ;         INTERRUPTS DISABLED!!!!!!!!!!
03300           LD      HL,VIDEO         ;INITIALIZE CURSOR POS'N
03320           LD      (CURADD),HL
03340           LD      HL,M1    ;PRINT MESSAGE 1
03360           CALL    VDLINE
03380           PUSH    BC
03400           LD      B,1      ;DELAY 1 SECOND
03420           CALL    LDELAY
03440           POP     BC
03460           LD      HL,1*64+VIDEO+15
03480           LD      (CURADD),HL
03500           LD      HL,M2    ;PRINT MESSAGE 2
03520           CALL    VDLINE
03540           PUSH BC
03560           LD      B,2      ;DELAY 2 SECONDS
03580           CALL    LDELAY
03600           POP     BC
03620           LD      HL,2*64+VIDEO
03640           LD      (CURADD),HL
03660           LD      HL,M3    ;PRINT MESSAGE 3
03680           CALL    VDLINE
03700           LD      HL,3*64+VIDEO
03720           LD      (CURADD),HL
03740           LD      HL,M11
03760           CALL    VDLINE
03780           LD      HL,4*64+VIDEO
03800           LD      (CURADD),HL
```

```
        LD      HL,M12
        CALL    VDLINE
        LD      HL,5*64+VIDEO
        LD      (CURADD),HL
        LD      HL,M13
        CALL    VDLINE
        LD      HL,6*64+VIDEO
        LD      (CURADD),HL
        LD      HL,M14
        CALL    VDLINE
        LD      HL,7*64+VIDEO
        LD      (CURADD),HL
        LD      HL,M15
        CALL    VDLINE
        LD      HL,8*64+VIDEO
        LD      (CURADD),HL
        LD      HL,M16
        CALL    VDLINE
        LD      HL,9*64+VIDEO
        LD      (CURADD),HL
        LD      HL,M17
        CALL    VDLINE
        LD      HL,10*64+VIDEO
        LD      (CURADD),HL
        LD      HL,M18
        CALL    VDLINE
        LD      HL,11*64+VIDEO
        LD      (CURADD),HL
        LD      HL,M19
        CALL    VDLINE
        LD      HL,12*64+VIDEO
        LD      (CURADD),HL
        LD      HL,M20
        CALL    VDLINE
        LD      HL,13*64+VIDEO
        LD      (CURADD),HL
        LD      HL,M21
        CALL    VDLINE
        LD      HL,15*64+VIDEO
        LD      (CURADD),HL
        LD      HL,M3
        CALL    VDLINE
        JP      MENSCN
;************************************************
;*   MENSCN:  MAIN MENU SCAN SUBROUTINE
;************************************************
MENSCN  PUSH    DE
        LD      A,BBLOCK
        LD      (CURCHAR),A
        LD      HL,15*64+VIDEO+50
        LD      (CURADD),HL
        LD      A,0EH
        CALL    VDCHAR
        LD      A,0
        LD      (BLINK),A
        CALL    KBWAIT
        LD      B,A
```

```
04880          LD      A,0FH
04900          CALL    VDCHAR
04920          LD      A,B
04940          CP      01H      ;BREAK KEY?
04960          JP      NZ,I1
04980          POP     DE
05000          JP      ZZZZZZ
05020 I1       CP      31H      ;ONE?
05040          JP      NZ,I2
05060          LD      (HL),A
05080          PUSH    BC
05100          LD      B,1
05120          CALL    LDELAY
05140          POP     BC
05160          POP     DE
05180          JP      MENU1
05200 I2       CP      32H      ;TW0?
05220          JP      NZ,I3
05240          LD      (HL),A
05260          PUSH    BC
05280          LD      B,3
05300          CALL    LDELAY
05320          POP     BC
05340          POP     DE
05360          JP      MENU2
05380 I3       CP      33H      ;THREE?
05400          JP      NZ,I4
05420          LD      (HL),A
05440          PUSH    BC
05460          LD      B,3
05480          CALL    LDELAY
05500          POP     BC
05520          POP     DE
05540          JP      MENU3
05560 I4       CP      34H      ;FOUR?
05580          JP      NZ,I5
05600          LD      (HL),A
05620          PUSH    BC
05640          LD      B,3
05660          CALL    LDELAY
05680          POP     BC
05700          POP     DE
05720          JP      MENU4
05740 I5       CP      35H      ;FIVE?
05760          JP      NZ,I6
05780          LD      (HL),A
05800          PUSH    BC
05820          LD      B,3
05840          CALL    LDELAY
05860          POP     BC
05880          POP     DE
05900          JP      MENU5
05920 I6       CP      36H      ;SIX?
05940          JP      NZ,I7
05960          LD      (HL),A
05980          PUSH    BC
06000          LD      B,3
```

```
06020         CALL    LDELAY
06040         POP     BC
06060         POP     DE
06080         JP      MENU6
06100 I7      CP      37H       ;SEVEN?
06120         JP      NZ,I8
06140         LD      (HL),A
06160         PUSH    BC
06180         LD      B,3
06200         CALL    LDELAY
06220         POP     BC
06240         POP     DE
06260         JP      MENU7
06280 I8      CP      38H       ;EIGHT?
06300         JP      NZ,I9
06320         LD      (HL),A
06340         PUSH    BC
06360         LD      B,3
06380         CALL    LDELAY
06400         POP     BC
06420         POP     DE
06440         JP      MENU8
06460 I9      CP      39H       ;NINE?
06480         JP      NZ,I0
06500         LD      (HL),A
06520         PUSH    BC
06540         LD      B,3
06560         CALL    LDELAY
06580         POP     BC
06600         POP     DE
06620         JP      MENU9
06640 I0      CP      30H       ;ZERO?
06660         JP      NZ,IA
06680         LD      (HL),A
06700         PUSH    BC
06720         LD      B,3
06740         CALL    LDELAY
06760         POP     BC
06780         POP     DE
06800         JP      MENU0
06801 IA      CP      41H       ;A?
06803         JP      NZ,ZZZZZZ         ;ILLEGAL COMMAND
06805         LD      (HL),A
06807         PUSH    BC
06809         LD      B,3
06811         CALL    LDELAY
06813         POP     BC
06815         POP     DE
06817         JP      MENUA
06820 MENU1   CALL VDCLS
06840         LD      HL,5*64+VIDEO
06860         LD      (CURADD),HL
06880         LD      HL,M11+4
06900         CALL    VDLINE
06920         CALL    BOX
06940         CALL    INFO
06960 MENU2   CALL    VDCLS
```

```
06980         LD     HL,5*64+VIDEO
07000         LD     (CURADD),HL
07020         LD     HL,M12+4
07040         CALL   VDLINE
07060         CALL   SENACQ
07080         CALL   SENDSP
07100         JP     RCV
07120 MENU3   JP     SENSCN
07140 MENU4   JP     BRUCE
07160 MENU5   PUSH   BC
07180         PUSH   HL
07200         LD     B,255
07220         LD     HL,OUTBUF
07240         CALL   WRCASS  ;WRITE OUBUF TO CASSETTE
07260         CALL   WRCASS  ;WRITE POSBUF TO CASSETTE
07280         POP    HL
07300         POP    BC
07320         JP     ZZZZZZ
07340 MENU6   PUSH   BC
07360         PUSH   HL
07380         LD     B,255
07400         LD     HL,OUTBUF
07420         CALL   RDCASS  ;LOAD OUTBUF FROM CASSETTE
07440         CALL   RDCASS  ;LOAD POSBUF FROM CASSETTE
07460         POP    HL
07480         POP    BC
07500         JP     ZZZZZZ
07520 MENU7   PUSH   BC
07540         PUSH   HL
07560         LD     B,255
07580         LD     HL,STEMP
07600         CALL   WRCASS  ;WRITE TEMP. PROFILE TO CASSETTE
07620         POP    HL
07640         POP    BC
07660         JP     ZZZZZZ
07680 MENU8   PUSH   BC
07700         PUSH   HL
07720         LD     B,255
07740         LD     HL,STEMP
07760         CALL   RDCASS  ;LOAD TEMP. PROFILE FROM CASSETTE
07780         POP    HL
07800         POP    BC
07820         JP     ZZZZZZ
07840 MENU9   CALL   SENACQ
07860         CALL   SENDSP
07880         CALL   KBBRK
07900         JP     NZ,ZZZZZZ        ;<BREAK> TO MAIN MENU
07920         JP     MENU9
07940 MENU0   PUSH   HL
07960         PUSH   IX
07970         CALL   VDCLS
07980         CALL   BOX
07990         CALL   SENACQ  ;DUMMY SENSOR READ SO DSPLAY WILL
                                  FLY!!!!!
08000         LD     HL,OUTBUF
08020         LD     IX,POSBUF
08040 SCANUD  LD     A,(HL)
```

```
         CP      ETX       ;TEST FOR END OF OUTPUT BUFFER
         JP      Z,STALL
         LD      (INBUF+3),A     ;STUFF INTO INPUT BUFFER
         LD      A,(IX)  ;CHARACTER TO PRINT
         LD      (INBUF+1),A     ;STUFF INTO INPUT BUFFER
;*****INPUT BUFFER IS NOW SET UP TO USE DSPLAY SUBROUTINE!
         PUSH    HL
         PUSH    IX
         CALL    DSPLAY
         POP     IX
         POP     HL
         INC     HL
         INC     IX
         PUSH    BC
         LD      BC,4000H
         CALL    DELYRS   ;SMALL DELAY FROM ROM TO SLOW
                            WRITING OF USER DATA
         POP     BC
         JP      SCANUD
STALL    POP     IX
         POP     HL
HERE     CALL    KBBRK    ;CHECK FOR BREAK KEY
         JP      NZ,ZZZZZZ
         JP      HERE
ILEGAL   JP      ZZZZZZ
MENUA    CALL    SETCLK
         PUSH    BC
         LD      B,255    ;255 SECOND DELAY TO EXIT HOUSE
         CALL    LDELAY
         POP     BC
         JP      MENU2    ;ENTER SECURITY LOOP
;*********************************************************
;*  LONG DELAY SUBROUTINE                                *
;*       USES SHORT DELAY ROUTINE IN ROM                 *
;*       (B) SECONDS DELAY                               *
;*********************************************************
LDELAY   PUSH    BC       ;LONG DELAY -- (B) SECONDS
         LD      BC,0H
         CALL    DELYRS   ;1 SEC DELAY FROM ROM
         POP     BC
         DJNZ    LDELAY
         RET
;*********************************************************
;*  TERMINATION ROUTINE                                  *
;*  BOUNCE BACK TO EDAS FOR IN-MEMORY ASSEMBLY           *
;*  DELETE FROM FINAL PROGRAM                            *
;*********************************************************
TERM     CALL    KBCHAR   ;LOOK FOR <ENTER> TO EXIT
         CP      CR
         JP      Z,ZZZZZZ;  JUMP TO MAIN MENU ON <ENTER>
         JP      TERM
;            ********
;*********************************************************
;*  SUBROUTINE BOX                                       *
;*********************************************************
BOX      PUSH    HL
```

```
08880         PUSH    DE
08900         LD      HL,BOXTOP
08920         LD      A,TBLOCK
08940         CALL    HBAR
08960         LD      HL,BOXTOP+128
08980         LD      A,MBLOCK
09000         CALL    HBAR
09020         LD      HL,BOXTOP+256
09040         LD      A,MBLOCK
09060         CALL    HBAR
09080         LD      HL,BOXTOP+384
09100         CALL    HBAR
09120         LD      HL,BOXTOP+512
09140         CALL    HBAR
09160         LD      HL,BOXTOP
09180         CALL    VBAR
09200         LD      HL,BOXTOP+38
09220         CALL    VBAR
09240         LD      HL,BOXTOP+51
09260         CALL    VBAR
09280         LD      HL,BOXTOP+63
09300         CALL    VBAR
09320         LD      HL,BOXTOP+104
09340         LD      (CURADD),HL
09360         LD      HL,M4    ;PRINT HOME PHONE
09380         CALL    VDLINE
09400         LD      HL,BOXTOP+232
09420         LD      (CURADD),HL
09440         LD      HL,M5    ;PRINT "WORK #"
09460         CALL    VDLINE
09480         LD      HL,BOXTOP+360
09500         LD      (CURADD),HL
09520         LD      HL,M6    ;PRINT "POLICE #"
09540         CALL    VDLINE
09560         LD      HL,BOXTOP+488
09580         LD      (CURADD),HL
09600         LD      HL,M7    ;PRINT "FIRE #"
09620         CALL    VDLINE
09640         LD      HL,BOXTOP+450
09660         LD      (CURADD),HL
09680         LD      HL,M8    ;PRINT "HOSP #"
09700         CALL    VDLINE
09720         LD      HL,BOXTOP+467
09740         LD      (CURADD),HL
09760         LD      HL,M9    ;PRINT "DOCTOR #"
09780         CALL    VDLINE
09800         POP     DE
09820         POP     HL
09840         RET
09860 ;*****************************************************
09880 ;*  DRAW A HORIZONTAL BAR                            *
09900 ;*****************************************************
09920 HBAR    LD      B,64
09940 HLOOP   LD      (HL),A
09960         INC     HL
09980         DJNZ    HLOOP
10000         RET
```

```
10020 ;*****************************************************
10040 ;*  DRAW A VERTICAL BAR                                *
10060 ;*****************************************************
10080 VBAR    LD      B,9
10100 VLOOP   LD      (HL),191
10120         LD      DE,64
10140         ADD     HL,DE
10160         DJNZ    VLOOP
10180         RET
10200         END     ZZZZZZ
20000 ;*****************************************************
20020 ;*  USER INFORMATION INPUT ROUTINE                     *
20040 ;*****************************************************
20060 INFO    LD      HL,BOXTOP+66     ;POINT TO START OF NAME
20080         LD      (CURADD),HL      ;INITIALIZE CURSOR POS'N
20100         LD      IY,POSBUF        ;POINT IY TO POSBUF
20120         LD      HL,OUTBUF        ;POINT HL TO BUFFER
20140         PUSH    BC
20160         LD      B,35    ;35= MAX NAME LENGTH
20180         CALL    KBLINE
20200         LD      A,1     ;POINT POSITION TO ST. OF 1ST LINE
20220         CALL    LPOSBF
20240         LD      C,B     ;B HOLDS # OF CHARACTERS ENTERED
20260         LD      B,0     ;CLEAR MSBYTE OF BC
20280         ADD     HL,BC   ;COMPUTE START ADDRESS OF NEXT
                                LINE
20300         CALL BOX
20320         PUSH    HL
20340         LD      HL,BOXTOP+194
20360         LD      (CURADD),HL
20380         POP     HL
20400         LD      B,35    ;35= MAX STREET #/NAME LENGTH
20420         CALL    KBLINE
20440         LD      A,36
20460         CALL    LPOSBF
20480         LD      C,B
20500         LD      B,0
20520         ADD     HL,BC
20540         CALL BOX
20560         PUSH    HL
20580         LD      HL,BOXTOP+322
20600         LD      (CURADD),HL
20620         POP     HL
20640         LD      B,35    ;35= MAX CITY, ETC. LENGTH
20660         CALL    KBLINE
20680         LD      A,71
20700         CALL    LPOSBF
20720         LD      C,B
20740         LD      B,0
20760         ADD     HL,BC
20780         CALL BOX
20800         PUSH HL
20820         LD      HL,1*64+53+BOXTOP
20840         LD      (CURADD),HL
20860         POP     HL
20880         LD      B,8
20900         CALL    KBLINE
```

```
LD      A,106
CALL    LPOSBF
LD      C,B
LD      B,0
ADD     HL,BC
CALL    BOX
PUSH HL
LD      HL,3*64+53+BOXTOP
LD      (CURADD),HL
POP     HL
LD      B,8
CALL    KBLINE
LD      A,114
CALL    LPOSBF
LD      C,B
LD      B,0
ADD     HL,BC
CALL    BOX
PUSH    HL
LD      HL,5*64+53+BOXTOP
LD      (CURADD),HL
POP     HL
LD      B,8
CALL    KBLINE
LD      A,122
CALL    LPOSBF
LD      C,B
LD      B,0
ADD     HL,BC
CALL    BOX
PUSH    HL
LD      HL,7*64+53+BOXTOP
LD      (CURADD),HL
POP     HL
LD      B,8
CALL    KBLINE
LD      A,130
CALL    LPOSBF
LD      C,B
LD      B,0
ADD     HL,BC
CALL    BOX
PUSH    HL
LD      HL,7*64+9+BOXTOP
LD      (CURADD),HL
POP     HL
LD      B,8
CALL    KBLINE
LD      A,138
CALL    LPOSBF
LD      C,B
LD      B,0
ADD     HL,BC
CALL    BOX
PUSH    HL
LD      HL,7*64+28+BOXTOP
LD      (CURADD),HL
```

```
22060          POP     HL
22080          LD      B,8
22100          CALL    KBLINE
22120          LD      A,146
22140          CALL    LPOSBF
22160          LD      C,B
22180          LD      B,0
22200          ADD     HL,BC
22220          LD      (HL),ETX        ;TERMINATE OUTPUT MESSAGE
22240          CALL    BOX
22260          POP     BC
22280          CALL    TERM
22300 LPOSBF   PUSH    BC
22320 START    LD      (IY),A
22340          INC     IY
22360          INC     A
22380          DJNZ    START
22400          POP     BC
22420          RET
22440 ;*******************************************************
22460 KYBD     CALL    KBCHAR
22480          CP      CR
22500          JP      Z,0000H ;RE-ENTER AT "MEM SIZE" PROMPT
22520          CALL    VDCHAR
22540          JP      KYBD
22560 ;**********************************************************
22580 ;*       START OF TRANSMITTER ROUTINE                    *
22600 ;**********************************************************
22620 ;**********************************************************
22640 ;*       INIT IS THE ENTRY POINT FOR XMTR ROUTINE        *
22660 ;*       XMTR REPEATS THE MESSAGE IN OUTBUF OVER AND OVER *
22680 ;**********************************************************
22700 XMT      DI
22720          LD      A,(OUTP1)
22740          OR      04H     ;RAISE BIT 3 TO TRANSMIT
22750          OR      08H     ;RAISE BIT 4 TO SOUND ALARM
22760          LD      (OUTP1),A
22780          OUT     (01H),A
22800 XMT1     CALL    STROUT
22820          JP      XMT1
22840 OUTBUF   DEFS    256     ;OUTPUT CHARACTER BUFFER
22860          DEFB    ETX     ;DEFAULT END TRANSMISSION
22880 POSBUF   DEFS    256     ;OUTPUT POSITION BUFFER
22900          DEFB    ETX     ;SAFETY VALVE?
22920 STROUT   PUSH    BC
22940          LD      HL,OUTBUF; INITIALIZE OUTPUT POINTER
22960          LD      IX,POSBUF; INITIALIZE POSITION POINTER
22980 CHROUT   LD      A,(HL)
23000          CP      ETX     ;TEST FOR END OF OUTPUT BUFFER
23020          JP      Z,EXIT
23040          CALL    KBBRK   ;<BREAK> JUMPS TO MAIN MENU!
23060          JP      NZ,ZZZZZZ
23080          LD      A,0     ;SEND START BYTE (00H)
23100          CALL    BYTE
23120          LD      A,(IX);SEND POSITION BYTE FIRST TIME
23140          CALL    BYTE
23160          LD      A,(IX);REPEAT POSITION BYTE
```

```
        CALL    BYTE
        LD      A,(HL)   ;SEND CHARACTER BYTE FIRST TIME
        CALL    BYTE
        LD      A,(HL)   ;REPEAT CHARACTER BYTE
        CALL    BYTE
        LD      A,0FFH   ;SEND STOP BYTE (FFH)
        CALL    BYTE
        INC     HL
        INC     IX
        JP      CHROUT
EXIT    POP     BC
        RET
BYTE    PUSH    BC
        LD      B,8
ROTATE  RLA
        JP      NC,ZEROT
ONET    CALL    OUT1
        JP      TEST
ZEROT   CALL    OUT0
TEST    DJNZ    ROTATE
        POP     BC
        RET
COSINE  DEFB    247
        DEFB    225
        DEFB    192
        DEFB    158
        DEFB    106
        DEFB    65
        DEFB    31
        DEFB    9
        DEFB    1
        DEFB    9
        DEFB    31
        DEFB    65
        DEFB    106
        DEFB    158
        DEFB    192
        DEFB    225
        DEFB    247
        DEFB    255
OUT1    LD      C,0
        IN      E,(C)    ;STROBE CLOCK TO INPUT PORT 0
        PUSH    HL
        PUSH    BC
        LD      B,10
TENCYC  PUSH    BC
        LD      B,36
        LD      HL,COSINE
P0      OUTI
        NOP
        NOP
        NOP
        NOP
        NOP
        NOP
        NOP
        NOP
```

```
24320          NOP
24340          NOP
24360          NOP
24380          DJNZ     P0
24400          POP      BC
24420          DJNZ     TENCYC
24440          POP      BC
24460          POP      HL
24480          RET
24500 OUT0     LD       C,0
24520          IN       E,(C)    ;STROBE CLOCK TO INPUT PORT 0
24540          PUSH     HL
24560          PUSH     BC
24580          LD       B,5
24600 FVECYC   PUSH     BC
24620          LD       B,36
24640          LD       HL,COSINE
24660 P1       OUTI
24680          NOP
24700          NOP
24720          NOP
24740          NOP
24760          NOP
24780          NOP
24800          NOP
24820          NOP
24840          NOP
24860          NOP
24880          NOP
24900          NOP
24920          NOP
24940          NOP
24960          NOP
24980          NOP
25000          NOP
25020          NOP
25040          NOP
25060          NOP
25080          NOP
25100          NOP
25120          NOP
25140          NOP
25160          NOP
25180          NOP
25200          NOP
25220          NOP
25240          NOP
25260          NOP
25280          DJNZ     P1
25300          POP      BC
25320          DJNZ     FVECYC
25340          POP      BC
25360          POP      HL
25380          RET
25400 ;*****************************************
25420 ;***      RECEIVER ROUTINE               ***
25440 ;*****************************************
```

```
25460 RCV      DI
25480 RCVR     CALL     MAILRD
25490          CALL     THERMAL ;THREE ZONE TEMPERATURE CONTROL ROU
25500          JP       RCVR
25520 INBUF    DEFM     'INBUFF'
25540 ACCUM    DEFB     0H
25560 FLAG     DEFB     0H
25580 ;****************************
25600 MAILRD   CALL     KBBRK   ;<BREAK> BOUNCES TO MAIN MENU
25620          JP       NZ,ZZZZZZ
25640          LD       A,(FLAG)
25660          CP       0H
25680          JP       NZ,INPUT
25700          LD       A,(ACCUM)
25720          CP       0H
25740          JP       Z,INPUT
25760          DEC      A
25780          LD       (ACCUM),A
25800 INPUT    IN       A,(0H)
25820          BIT      1,A
25840          SCF
25860 CLEAR    LD       HL,VIDEO+256
25880          LD       DE,VIDEO+257
25900          LD       BC,63
25920          LD       (HL),128
25940          LDIR
25960          JP       Z,ZEROR
25980 ONER     JP       SHIFTL
26000 ZEROR    CCF
26020 SHIFTL   LD       HL,INBUF+5
26040          RL       (HL)
26060          DEC      HL
26080          RL       (HL)
26100          DEC      HL
26120          RL       (HL)
26140          DEC      HL
26160          RL       (HL)
26180          DEC      HL
26200          RL       (HL)
26220          DEC      HL
26240          RL       (HL)
26260 ;START DATA VALIDATION SEQUENCE
26280 STRBYT   LD       A,(INBUF)
26300          CP       0H
26320          LD       HL,VIDEO+256
26340          LD       (HL),191
26360          JP       Z,STPBYT
26380          LD       HL,DLY
26400          CALL SENTST
26420          RET
26440 STPBYT   LD       A,(INBUF+5)
26460          CP       0FFH
26480          LD       HL,VIDEO+257
26500          LD       (HL),191
26520          JP       Z,POSBYT
26540          LD       HL,DLY
26560          CALL     SENTST
```

```
26580          RET
26600 POSBYT   LD      A,(INBUF+1)
26620          LD      HL,INBUF+2
26640          CP      (HL)
26660          LD      HL,VIDEO+258
26680          LD      (HL),191
26700          JP      Z,NUMBER
26720          LD      HL,DLY
26740          CALL    SENTST
26760          RET
26780 NUMBER   JP      CHAR     ;BYPASS IT!!!!!
26800          LD      HL,VIDEO+259
26820          LD      (HL),191
26840          JP      M,SMALL
26860          LD      HL,DLY
26880          CALL    SENTST
26900          RET
26920 SMALL    CP      1
26940          LD      HL,VIDEO+260
26960          LD      (HL),191
26980          JP      P,CHAR
27000          LD      HL,DLY
27020          CALL    SENTST
27040          RET
27060 CHAR     LD      A,(INBUF+3)
27080          LD      HL,INBUF+4
27100          CP      (HL)
27120          LD      HL,VIDEO+261
27140          LD      (HL),191
27160          JP      Z,VALID1
27180          LD      HL,DLY
27200          CALL    SENTST
27220          RET
27240 VALID1   CP      91
27260          LD      HL,VIDEO+262
27280          LD      (HL),191
27300          JP      M,VALID2
27320          LD      HL,DLY
27340          CALL    SENTST
27360          RET
27380 VALID2   CP      32
27400          LD      HL,VIDEO+263
27420          LD      (HL),191
27440          JP      P,TURNON
27460 J1       LD      HL,DLY
27480          CALL    SENTST
27500          RET
27520 TURNON   LD      A,(FLAG)
27540          CP      0H
27560          JP      NZ,DSPLAY
27580          LD      A,(ACCUM)
27600          ADD     A,50
27620          LD      (ACCUM),A
27640          CP      55
27660          JP      M,J1
27680          LD      A,1
27700          LD      (FLAG),A
```

```
27720         CALL    BOX
27725         LD      A,(OUTP1)
27735         OR      08H      ;RAISE BIT 4 TO SOUND ALARM
27736         LD      (OUTP1),A
27737         OUT     (01H),A
27740 DSPLAY  PUSH    DE
27760         LD      A,(INBUF+1)      ;POSITION BYTE
27780         LD      HL,1*64+BOXTOP+1
27800         CP      36
27820         JP      M,PRINT
27840         LD      HL,3*64+BOXTOP+1-35
27860         CP      71
27880         JP      M,PRINT
27900         LD      HL,5*64+BOXTOP+1-70
27920         CP      106
27940         JP      M,PRINT
27960         LD      HL,1*64+52+BOXTOP-105
27980         CP      114
28000         JP      M,PRINT
28020         LD      HL,3*64+52+BOXTOP-113
28040         CP      122
28060         JP      M,PRINT
28080         LD      HL,5*64+52+BOXTOP-121
28100         CP      130
28120         JP      M,PRINT
28140         LD      HL,7*64+52+BOXTOP-129
28160         CP      138
28180         JP      M,PRINT
28200         LD      HL,7*64+8+BOXTOP-137
28220         CP      146
28240         JP      M,PRINT
28260         LD      HL,7*64+27+BOXTOP-145
28280         CP      154
28300         JP      M,PRINT
28320         POP     DE
28340         LD      HL,DLY
28360         CALL    SENTST
28380         RET
28400 PRINT   LD      D,0
28420         LD      E,A
28440         ADD     HL,DE
28460         LD      A,(INBUF+3)      ;CHARACTER TO PRINT
28480         LD      (HL),A
28500         POP     DE
28520         LD      HL,DLY
28540         CALL    SENTST
28560         RET
28580 SENTST  LD      IY,SENSOR+128    ;IY+D POINTER TO SENSOR
28600         LD      A,(MARK+2)       ;SENSOR # IS IN (MARK+2)
28620         SUB     128     ;REMOVE OFFSET FROM DISPLACEMENT
28640         CALL    SENSRD  ;READ CURRENT SENSOR VALUE
28660 MARK    LD      B,(IY+7);READ PREVIOUS SENSOR VALUE
28680         CP      B       ;COMPARE B TO A
28700         JP      Z,DEPART;PROCEED IF A MATCH
28720         LD      A,(MARK+2)       ;READ SENSOR #+128
28740         SUB     128     ;REMOVE OFFSET
28760         LD      B,A
```

```
28780          CALL     DECDIS  ;DISPLAY OFFENDING SENSOR #
28782          IN       A,(0)   ;READ PORT 0
28784          AND      8       ;  8 = 00001000, MASK OFF ALL BUT
                         PWR BIT
28786          JP       NZ,DEPART       ;BYPASS JUMP TO XMT IF
                         ENTRY KEY IS ACTIVE
28800          JP       XMT
28820 DEPART   LD       A,(MARK+2)      ;FETCH SENSOR #
28840          INC      A       ;INCREMENT SENSOR #
28860          LD       (MARK+2),A      ;RESTORE NEXT SENSOR #
28880 DELAY    DEC      HL
28900          LD       A,H
28920          OR       L
28940          JP       NZ,DELAY
28960          RET
28980          END      ZZZZZZ  ;ZZZZZZ IS THE TRANSFER ADDRESS
30000 CLERE    EQU      1FH
30020 AT       EQU      40H
30040 VDLINE   EQU      021BH
30060 UPPER2   EQU      128
30080 LOWER2   EQU      896
30100 UPPER1   EQU      256
30120 LOWER1   EQU      768
30140 DOT1     EQU      02H
30160 UPPER    EQU      384
30180 LOWER    EQU      640
30200 VDCHAR   EQU      0033H
30220 DOT      EQU      05FH
30240 LARROW   EQU      08H
30260 RARROW   EQU      09H
30280 DARROW   EQU      0AH
30300 UARROW   EQU      5BH
30320 KBWAIT   EQU      0049H
30340 VDCLS    EQU      01C9H
30360 VIDEO    EQU      3C00H
30380 UBAR     EQU      131
30400 MBAR     EQU      140
30420 DBAR     EQU      176
30440 CURSOR   EQU      4020H
30460 BRK      EQU      01H
30480 CCURSOR  EQU      4023H
30500 BRUCE    CALL     DRAW
30520          CALL     OVER
30540          CALL     DECODE
30560          JP       LOOP
30580 DRAW     CALL     VDCLS
30600          LD       HL,MSG1
30620          CALL     VDLINE
30640          LD       HL,MSG2
30660          CALL     VDLINE
30680          LD       HL,MSG25
30700          CALL     VDLINE
30720          LD       HL,MSG3
30740          CALL     VDLINE
30760          LD       HL,MSG4
30780          CALL     VDLINE
30800          LD       HL,MSG5
```

```
30820          CALL   VDLINE
30840          LD     HL,MSG6
30860          CALL   VDLINE
30880          LD     HL,MSG7
30900          CALL   VDLINE
30920          LD     HL,MSG8
30940          CALL   VDLINE
30960          LD     HL,MSG9
30980          CALL   VDLINE
31000          LD     HL,MSG10
31020          CALL   VDLINE
31040          LD     HL,MSG12
31060          CALL   VDLINE
31080          LD     HL,MSG14
31100          CALL   VDLINE
31120          LD     HL,MSG11
31140          CALL   VDLINE
31160          LD     HL,MSG13
31180          CALL   VDLINE
31200          LD     HL,MSG15
31220          CALL   VDLINE
31240          LD     A,0FH
31260          CALL   VDCHAR
31280          LD     BC,UPPER
31300          LD     HL,VIDEO+2
31320          ADD    HL,BC
31340          LD     B,62
31360 LOOP2    LD     (HL),DOT
31380          INC    HL
31400          DJNZ   LOOP2
31420          LD     BC,LOWER
31440          LD     HL,VIDEO+2
31460          ADD    HL,BC
31480          LD     B,62
31500 LOOP3    LD     (HL),DOT
31520          INC    HL
31540          DJNZ   LOOP3
31560          LD     BC,UPPER1
31580          LD     HL,VIDEO+2
31600          ADD    HL,BC
31620          LD     B,62
31640 LOOP4    LD     (HL),DOT
31660          INC    HL
31680          DJNZ   LOOP4
31700          LD     BC,LOWER1
31720          LD     HL,VIDEO+2
31740          ADD    HL,BC
31760          LD     B,62
31780 LOOP5    LD     (HL),DOT
31800          INC    HL
31820          DJNZ   LOOP5
31840          LD     BC,UPPER2
31860          LD     HL,VIDEO+2
31880          ADD    HL,BC
31900          LD     B,62
31920 LOOP6    LD     (HL),DOT
31940          INC    HL
31960          DJNZ   LOOP6
```

```
        LD      BC,LOWER2
        LD      HL,VIDEO+2
        ADD     HL,BC
        LD      B,62
LOOP7   LD      (HL),DOT
        INC     HL
        DJNZ    LOOP7
        LD      HL,2*64+VIDEO+2
        CALL    VLINE
        LD      HL,128+VIDEO+6
        CALL    VLINE
        LD      HL,128+VIDEO+10
        CALL    VLINE
        LD      HL,128+VIDEO+14
        CALL    VLINE
        LD      HL,128+VIDEO+18
        CALL    VLINE
        LD      HL,128+VIDEO+26
        CALL    VLINE
        LD      HL,128+VIDEO+30
        CALL    VLINE
        LD      HL,128+VIDEO+34
        CALL    VLINE
        LD      HL,128+VIDEO+38
        CALL    VLINE
        LD      HL,128+VIDEO+42
        CALL    VLINE
        LD      HL,2*64+VIDEO+22
        CALL    VLINE
        LD      HL,128+VIDEO+46
        CALL    VLINE
        LD      HL,128+VIDEO+50
        CALL    VLINE
        LD      HL,128+VIDEO+54
        CALL    VLINE
        LD      HL,128+VIDEO+58
        CALL    VLINE
        LD      HL,128+VIDEO+62
        CALL    VLINE
        RET
OVER    LD      HL,VIDEO+2
        LD      BC,512
        ADD     HL,BC
        LD      (CURSOR),HL
        INC     HL
        LD      B,61
LOOP1   LD      (HL),140
        INC     HL
        DJNZ    LOOP1
        LD      DE,CCURSOR
        LD      A,140
        LD      (DE),A
        LD      A,0EH
        CALL    VDCHAR
        LD      BC,VIDEO+2
        RET
VECTOR  LD      A,0FH
```

```
        CALL    VDCHAR
        JP      ZZZZZZ
LOOP    CALL    KBWAIT
        CP      BRK
        JP      Z,VECTOR
        CP      UARROW
        JP      Z,UP
        CP      DARROW
        JP      Z,DOWN
        CP      RARROW
        JP      Z,RIGHT
        CP      LARROW
        JP      Z,LEFT
        CP      AT
        JP      Z,ATRT
        CP      CLERE
        JP      NZ,HIM
        CALL    DRAW
        CALL    OVER
HIM     CP      0DH
        JP      NZ,JULIEN
        CALL    ENCODE
        CALL    DECODE
JULIEN  JP      LOOP
UP      LD      A,(CCURSOR)
        CP      UBAR
        JP      Z,UPPERA
        CP      MBAR
        JP      Z,MIDDLE
        CP      DBAR
        JP      Z,DOWNER
UPPERA  LD      DE,128
        LD      HL,(CURSOR)
        SBC     HL,DE
        SBC     HL,BC
        JP      Z,LOOP
        LD      DE,64
        LD      HL,(CURSOR)
        SBC     HL,DE
        LD      A,0FH
        CALL    VDCHAR
        LD      (CURSOR),HL
        LD      DE,CCURSOR
        LD      A,DBAR
        LD      (DE),A
        LD      A,0EH
        CALL    VDCHAR
        JP      LOOP
MIDDLE  LD      DE,CCURSOR
        LD      A,UBAR
        LD      (DE),A
        LD      A,0EH
        CALL    VDCHAR
        JP      LOOP
DOWNER  LD      DE,CCURSOR
        LD      A,MBAR
        LD      (DE),A
```

```
34260          LD      A,0EH
34280          CALL    VDCHAR
34300          JP      LOOP
34320 DOWN     LD      A,(CCURSOR)
34340          CP      UBAR
34360          JP      Z,UPPERB
34380          CP      MBAR
34400          JP      Z,MIDDLE1
34420          CP      DBAR
34440          JP      Z,DOWNER1
34460 UPPERB   LD      DE,CCURSOR
34480          LD      A,MBAR
34500          LD      (DE),A
34520          LD      A,0EH
34540          CALL    VDCHAR
34560          JP      LOOP
34580 MIDDLE1  LD      DE,CCURSOR
34600          LD      A,DBAR
34620          LD      (DE),A
34640          LD      A,0EH
34660          CALL    VDCHAR
34680
34700          JP      LOOP
34720 DOWNER1  LD      DE,960
34740          LD      HL,(CURSOR)
34760          SBC     HL,DE
34780          SBC     HL,BC
34800          JP      Z,LOOP
34820          LD      DE,64
34840          LD      HL,(CURSOR)
34860          ADD     HL,DE
34880          LD      A,0FH
34900          CALL    VDCHAR
34920          LD      (CURSOR),HL
34940          LD      DE,CCURSOR
34960          LD      A,UBAR
34980          LD      (DE),A
35000          LD      A,0EH
35020          CALL    VDCHAR
35040          JP      LOOP
35060 RIGHT    LD      HL,00
35080          ADD     HL,BC
35100          LD      DE,VIDEO+63
35120          SBC     HL,DE
35140          JP      Z,LOOP
35160          INC     BC
35180          CALL    SCAN
35200          CALL    FIND
35220          JP      LOOP
35240 LEFT     LD      HL,00
35260          ADD     HL,BC
35280          LD      DE,VIDEO+2
35300          SBC     HL,DE
35320          JP      Z,LOOP
35340          DEC     BC
35360          CALL    SCAN
35380          CALL    FIND
```

```
35400          JP      LOOP
35420 ATRT     LD      HL,00
35440          ADD     HL,BC
35460          LD      DE,VIDEO+63
35480          SBC     HL,DE
35500          JP      Z,LOOP
35520          INC     BC
35540          CALL    SCAN
35560          LD      (HL),128
35580          LD      HL,(CURSOR)
35600          INC     HL
35620          LD      A,(CCURSOR)
35640          CALL    FIND
35660          JP      LOOP
35680 SCAN     LD      HL,00
35700          ADD     HL,BC
35720 ADLINE   EX      DE,HL
35740          LD      A,(DE)
35760          EX      DE,HL
35780          CP      MBAR
35800          JP      Z,FALSTAFF
35820          CP      UBAR
35840          JP      Z,FALSTAFF
35860          CP      DBAR
35880          JP      Z,FALSTAFF
35900          LD      DE,64
35920          ADD     HL,DE
35940          JP      ADLINE
35960 FALSTAFF         RET
35980 FIND     CP      MBAR
36000          JP      Z,FOUND1
36020          CP      UBAR
36040          JP      Z,FOUND2
36060          CP      DBAR
36080          JP      Z,FOUND3
36100 FOUND1   LD      DE,(CURSOR)      ;OLD CURSOR ADDRESS
36120          LD      (CURSOR),HL      ;NEW CURSOR ADDRESS
36140          LD      A,(CCURSOR)      ;OLD CURSOR CHAR.
36160          LD      (DE),A
36180          LD      A,MBAR           ;NEW CURSOR CHAR
36200          LD      (CCURSOR),A      ;IN THE NEW ADDRESS
36220          JP      RETURN
36240 FOUND2   LD      DE,(CURSOR)
36260          LD      (CURSOR),HL
36280          LD      A,(CCURSOR)
36300          LD      (DE),A
36320          LD      A,UBAR
36340          LD      (CCURSOR),A
36360          JP      RETURN
36380 FOUND3   LD      DE,(CURSOR)
36400          LD      (CURSOR),HL
36420          LD      A,(CCURSOR)
36440          LD      (DE),A
36460          LD      A,DBAR
36480          LD      (CCURSOR),A
36500 RETURN   RET
36520 ; DRAW A VERTICAL LINE
```

```
36540 VLINE    PUSH   BC
36560          LD     B,13
36580 VLOOOP   LD     (HL),DOT1
36600          LD     DE,64
36620          ADD    HL,DE
36640          DJNZ   VLOOOP
36660          POP    BC
36680          RET
36700          DEFB   0DH
36720 MSG6     DEFM   '76'
36740          DEFB   0DH
36760 MSG7     DEFM   '73'
36780          DEFB   0DH
36800 MSG8     DEFM   '70'
36820          DEFB   0DH
36840 MSG9     DEFM   '67'
36860          DEFB   0DH
36880 MSG10    DEFM   '64'
36900          DEFB   0DH
36920 MSG12    DEFM   '61'
36940          DEFB   0DH
36960 MSG14    DEFM   '58'
36980          DEFB   0DH
37000 MSG11    DEFM   '55'
37020          DEFB   0DH
37040 MSG13    DEFM   '52'
37060          DEFB   0DH
37080 MSG1     DEFM   '  5        7        9       11        13
                        15        17        19'
37100          DEFB   0DH
37120 MSG2     DEFM   '       6        8        10        12        14
                        16        18        20'
37140          DEFB   0DH
37160 MSG3     DEFM   '85'
37180          DEFB   0DH
37200 MSG15    DEFM   '49'
37220          DEFB   03H
37240 MSG4     DEFM   '82'
37260          DEFB   0DH
37280 MSG5     DEFM   '79'
37300          DEFB   0DH
37320 MSG25    DEFM   '88'
37340          DEFB   0DH
37360 ;*******************************************
37380 ;**** ENCODE THE VIDEO RAM INTO TEMPS *****
37400 ;*******************************************
37420 ENCODE   LD     DE,(CURSOR)
37440          LD     A,0FH
37460          PUSH   DE
37480          CALL   VDCHAR
37500          POP    DE
37520          LD     A,(CCURSOR)
37540          LD     (DE),A
37560          LD     BC,VIDEO+2
37580          LD     IX,STEMP
37600 SAM      CALL   SCAN
37620          SBC    HL,BC
```

```
        SRL     H
        RR      L
        SRL     H
        RR      L
        SRL     H
        RR      L
        SRL     H
        RR      L
        SRL     H
        RR      L
        SRL     H
        RR      L
        LD      DE,00
        EX      DE,HL
        ADD     HL,DE
        ADD     HL,DE
        ADD     HL,DE
        CP      MBAR
        JP      Z,GOOD
        CP      DBAR
        JP      Z,BAD
        JP      UGLY
BAD     INC     HL
GOOD    INC     HL
UGLY    LD      (IX),L
        LD      HL,00
        ADD     HL,BC
        LD      DE,VIDEO+63
        SBC     HL,DE
        RET     Z
        INC     BC
        INC     IX
        JP      SAM
STEMP   DEFB    25,25,25,25,25,25,25,25,25,25
        DEFB    25,25,25,25,25,25,25,25,25,25
        DEFB    25,25,25,25,25,25,25,25,25,25
        DEFB    25,25,25,25,25,25,25,25,25,25
        DEFB    25,25,25,25,25,25,25,25,25,25
        DEFB    25,25,25,25,25,25,25,25,25,25
        DEFB    25,25,25,25,25,25,25,25,25,25
        DEFB    25,25,25,25,25,25,25,25,25,25
;*********************************************
;**** DECODES TEMPS INTO VIDEO DISPLAY *********
;*********************************************
DECODE  CALL    DRAW
        LD      BC,VIDEO+2
        LD      IX,STEMP
MENDEZ  LD      HL,00
        ADD     HL,BC
        LD      DE,0
        ADD     HL,DE
        LD      A,(IX)
HIRT    CP      3
        JP      M,ANDRE
        LD      DE,64
        ADD     HL,DE
        SUB     3
```

```
38780          JP      HIRT
38800 ANDRE    CP      2
38820          JP      Z,MDBAR
38840          CP      1
38860          JP      Z,MMBAR
38880          CP      0
38900          JP      Z,MUBAR
38920 MUBAR    LD      (HL),UBAR
38940          JP      ARBAN
38960 MMBAR    LD      (HL),MBAR
38980          JP      ARBAN
39000 MDBAR    LD      (HL),DBAR
39020 ARBAN    LD      HL,00
39040          ADD     HL,BC
39060          LD      DE,VIDEO+63
39080          SBC     HL,DE
39100          JP      Z,CLARK
39120          INC     BC
39140          INC     IX
39160          JP      MENDEZ
39180 CLARK    LD      BC,VIDEO+2
39200          CALL    SCAN
39220          EX      DE,HL
39240          LD      A,(DE)
39260          LD      (CCURSOR),A
39280          LD      (CURSOR),DE
39300          EX      DE,HL
39320          LD      (HL),128
39340          LD      A,0EH
39360          CALL    VDCHAR
39380          RET
39400 ;*****************************************************
39420 ;*****     SENSOR SCAN ROUTINE      ******************
39440 ;*****************************************************
39460 SENSCN   PUSH    BC
39480          LD      B,255
39500 L3       LD      A,B
39520          CALL    SENSRD
39540          CP      0
39560          JP      Z,LEAVE
39580          DJNZ    L3
39600          POP     BC
39620          CALL    KBBRK
39640          JP      NZ,ZZZZZZ       ;<BREAK> TO MAIN MENU
39660          JP      SENSCN
39680 LEAVE    CALL    DECDIS
39700          POP     BC
39720          JP      XMT
39740 ;************************************************
39760 ;*****      SENSOR READ SUBROUTINE     ************
39780 ;************************************************
39800 ;
39820 ;***  SENSRD ASSUMES THAT THE SENSOR ADDRESS  ****
39840 ;***  TO BE READ IS IN THE A REGISTER ON ENTRY ***
39860 ;***  IT RETURNS A ONE IN THE LSB OF THE A    ****
39880 ;*** REGISTER IF THE CIRCUIT IS OPEN ... A ZERO **
39900 ;*** OTHERWISE.                                ***
```

```
;*************************************************
OUTP1   DEFB    01H       ;OUTPUT PORT ONE STORAGE
SENSRD  PUSH    BC
        LD      C,A       ;SAVE A IN C FOR MASSAGING
        LD      A,(OUTP1)
        LD      B,8
YYYYYY  SLA     C         ;SHIFT C7 INTO CARRY
        SET     1,A
        JP      NC,XXXXXX
        RES     1,A
XXXXXX  SET     0,A       ;RAISE CLOCK LINE TO BE SURE
        OUT     (1),A
        RES     0,A       ;DROP CLOCK LINE
        OUT     (1),A
        SET     0,A       ;RAISE CLK LINE AGAIN
        OUT     (1),A
        DJNZ    YYYYYY
        IN      A,(0)     ;READ INPUT PORT
        AND     01H       ;MASK ALL BUT A0
        POP     BC
        RET
;***********************************************
;****** DECIMAL DISPLAY SUBROUTINE ************
;***********************************************
DECDIS  LD      DE,00
        LD      A,B
HAL     CP      100
        JP      M,HUNDRED
        INC     DE
        SUB     100
        JP      HAL
HUNDRED LD      (HUNDREDS),DE
        LD      DE,00
POINS   CP      10
        JP      M,TEN
        INC     DE
        SUB     10
        JP      POINS
TEN     LD      (TENS),DE
        LD      DE,00
SACK    CP      1
        JP      M,ONE
        INC     DE
        SUB     1
        JP      SACK
ONE     LD      (ONES),DE
        LD      DE,30H
        LD      HL,(HUNDREDS)
        ADD     HL,DE
        LD      (HUNDREDS),HL
        LD      HL,(TENS)
        ADD     HL,DE
        LD      (TENS),HL
        LD      HL,(ONES)
        ADD     HL,DE
        LD      (ONES),HL
        LD      DE,VIDEO
```

```
        LD      A,(HUNDREDS)
        LD      (DE),A
        INC     DE
        LD      A,(TENS)
        LD      (DE),A
        INC     DE
        LD      A,(ONES)
        LD      (DE),A
        RET
HUNDREDS        DEFB    00H
TENS    DEFB    00H
ONES    DEFB    00H
;*****************************************
;**** WRITE (B) BYTES TO CASSETTE *********
;***** ENTRY CONDITIONS: HL POINTS TO OUTBUF,
;****  B HOLDS # OF BYTES TO BE TRANSFERRED
;*****************************************
WRCASS  PUSH    HL
        PUSH    BC
        CALL    SETCAS
        LD      A,0FH   ;TURN CORSOR OFF
        CALL    VDCHAR
        POP     BC
        POP     HL
        CALL    KBWAIT
        CALL    CSHWR
SIR     LD      A,(HL)
        INC     HL
        CALL    CSOUT
        DJNZ    SIR
        CALL    CSOFF
        RET
;******************************************
;**** READ (B) BYTES FROM CASSETTE *********
;**** ENTRY CONDITIONS:  HL POINTS TO OUTBUF,
;**** B HOLDS # OF BYTES TO BE TRANSFERRED.
;******************************************
RDCASS  PUSH    HL
        PUSH    BC
        CALL    SETCAS
        LD      A,0FH   ;TURN CURSOR OFF
        CALL    VDCHAR
        POP     BC
        POP     HL
        CALL    KBWAIT
        CALL    CSHIN
SIRD    CALL    CSIN
        LD      (HL),A
        INC     HL
        DJNZ    SIRD
        CALL    CSOFF
        RET
        END     ZZZZZZ  ;ZZZZZZ IS THE TRANSFER ADDRESS.
;*************************************
;       SENSOR ACQUIRE ROUTINE
;*************************************
SENSOR  DEFS    256
```

```
50080 SENACQ  LD      HL,SENSOR+255   ;POINTER
50100         PUSH    BC
50120         LD      B,255
50140 L4      LD      A,B
50160         CALL    SENSRD
50180         LD      (HL),A
50200         DEC     HL
50220         DJNZ    L4
50240         LD      A,0H
50260         CALL    SENSRD
50280         LD      (HL),A
50300         POP     BC
50320         RET
50340 ;*************************************
50360 ;          SENSOR DISPLAY ROUTINE
50380 ;*************************************
50400 SENDSP  PUSH    DE
50420         PUSH    BC
50440         CALL    VDCLS
50460         LD      DE,SENSOR+255
50480         LD      HL,VIDEO+255
50500         LD      B,255
50520 L5      LD      A,(DE)
50540         ADD     A,30H    ;0=30H,1=31H
50560         LD      (HL),A
50580         DEC     HL
50600         DEC     DE
50620         DJNZ    L5
50640         LD      A,(DE)
50660         ADD     A,30H
50680         LD      (HL),A
50700         POP     BC
50720         POP     DE
50740         RET
60000 ;*****************************************
60020 ;*    ZONAL TEMPERATURE CONTROL ROUTINE  *
60040 ;*****************************************
60060 T1      DEFB    25 ;RESERVE STORAGE FOR ZONE TEMPS
60080 T2      DEFB    25
60100 T3      DEFB    25
60120 ZONE    DEFB    2  ;COUNTER BYTE FOR (ZONE NO. MINUS 1)
60140 THERMAL PUSH    HL
60150         PUSH    IX ;USE IX AS POINTER TO TEMP/TIME ARRAY
                        (STEMP IN BRUCE'S ROUTINE)
60160         PUSH    IY ;USE IY AS POINTER FOR ZONE TEMP
                        (T1,T2,T3)
60170         PUSH    BC ;B USED IN COMPARISONS BELOW
60171 ;
60172 ;       IN WHAT FOLLOWS, IX & IY ARE USED AS POINTERS
60174 ;       TO THE START OF THEIR RESPECTIVE ARRAYS.  THE
60176 ;       ARRAYS ARE INDEXED INTO VIA THE DISPLACEMENT
60178 ;       BYTE OF THE RELEVANT INDIRECT ADDRESSING MODE
60179 ;
60180         LD      IX,STEMP         ;START OF TEMP ARRAY
60200         LD      IY,T1            ;START OF ZONE TEMP ARRAY
60220         LD      A,(ZONE)
```

```
60240          LD      HL,RAISE+2
60260          LD      (HL),A
60262          LD      HL,DROP+2
60264          LD      (HL),A
60266          LD      HL,ZTEMP+2
60268          LD      (HL),A
60280          LD      A,(TIME)
60300          LD      HL,TTEMP+2
60320          LD      (HL),A
60340 ;        TIME AND ZONE POINTERS SET UP NOW
60360          LD      A,(ZONE)          ;GET CURRENT ZONE NO.
                 (INTEGER BETWEEN 1 AND 3 INCLUSIVE)
60380          SLA     A        ;SHIFT ZONE NO. LEFT 3 BITS
60400          SLA     A
60420          SLA     A
60440          OR      64       ;01000000 (ADD 01 TO FRONT END;
                       SEE PP. 203-204 Z-80 ASSEMBLY LANG.
                       PROG. MANUAL)
60460          OR      7        ;00000111 (ADD 111 TO TAIL END AS
                       REGISTER CODE; SAME REFERENCE)
60480 ;        A SHOULD NOW CONTAIN THE BIT/REGISTER COMBO. TO
                       TEST BIT ZONE+5 OF ACCUMULATOR
60500 ;        STORE IT IN THE SECOND BYTE OF THE BIT TEST
                       INSTRUCTION
60520          LD      HL,BITTST+1
60540          LD      (HL),A
60560 ;
60580 ;        DISPLACEMENT BYTES AND BIT/REG TO TEST NOW SET UP
60600 ;
60620          IN      A,(0)    ;READ INPUT PORT 0
60640 BITTST   BIT 0,A          ;THE 0 AND THE A ARE PLACE
                      HOLDERS FOR SYNTAX PURPOSES
60660 ;        IF ZERO FLAG IS SET, TEMP T(ZONE) IS TOO HIGH
60662          JP      NZ,RAISE
60664 DROP     DEC     (IY+2)   ;THE 2 IS A PLACEHOLDER
60666          JP      GOON
60668 RAISE    INC     (IY+2)   ;THE 2 IS A PLACEHOLDER
60670 GOON     NOP
60672 ZTEMP    LD      A,(IY+2);THE 2 IS A PLACEHOLDER
60674 TTEMP    LD      B,(IX+2);THE 2 IS A PLACEHOLDER
60676          CP      B
60680          JP      NZ,FURNOFF       ;MINUS MEANS ZONE TEMP
                      HIGHER THAN PROFILE
60700 FURNON   LD      A,(ZONE)
60720          ADD     A,5
60740          SLA     A
60760          SLA     A
60780          SLA     A        ;SHIFT ZONE+5 INTO BITS 3,4,5 OF A
60800          OR      192      ;ADD 11 TO LEAD BITS
60820          OR      6        ;ADD 110 TO TAIL BITS
60840 ;        BYTE READY
60860          LD      HL,BITSET+1
60880          LD      (HL),A   ;BYTE 2 OF BIT SET INSTRUCTION
                       SET UP
60900          LD      HL,OUTP1
60920 BITSET   SET     0,(HL)   ;THE 0 IS A PLACEHOLDER
```

```
60940         JP      THERMEX
60960 FURNOFF LD      A,(ZONE)
60980         ADD     A,5
61000         SLA     A
61020         SLA     A
61040         SLA     A       ;SHIFT ZONE+5 INTO BITS 3,4,5
                      OF A
61060         OR      192     ;ADD 11 TO LEAD BITS
61080         OR      6       ;ADD 110 TO TAIL BITS
61100 ;       BYTE READY
61120         LD      HL,BITCLR+1
61140         LD      (HL),A  ;BYTE 2 OF BIT CLEAR INSTRUCTION
                       SET UP
61160         LD      HL,OUTP1
61180 BITCLR  RES     0,(HL)  ;THE 0 IS A PLACEHOLDER
61200 THERMEX LD      A,(HL)  ;A <-- (OUTP0)
61220         OUT     (0),A   ;WRITE A TO OUTPUT PORT 0
61240         LD      A,(ZONE)
61260         CP      3
61280         JP      NZ,ZONEINC
61300         LD      A,0
61320 ZONEINC INC     A
61322         LD      (ZONE),A        ;STORE NEW ZONE NO.
61324         LD      HL,ZDISP+2
61326         LD      (HL),A
61328 ZDISP   LD      A,(IY+2)        ;THE 2 IS A PLACEHOLDER
61330         OUT     (0),A   ;THROW NEXT ZONE TEMP
                      APPROXIMATION AT D/A CONVERTER
61340         POP     BC
61360         POP     IY
61380         POP     IX
61400         POP     HL
61420         RET     ;EXIT ZONAL TEMPERATURE CONTROL ROUTINE
61440 ;*********************************************************
61460 ;
61480 ;*********************************************************
61500 ;*      REAL TIME CLOCK ROUTINE                         *
61520 ;*********************************************************
61540 TIME    DEFB    0       ;RESERVE STORAGE FOR 1/4 HR. TIME
61560 CLOCK   LD      A,(TIME)
61580         INC     A
61600         LD      (TIME),A
61620 ;NO. OF PASSES COUNTER WILL BE ADDED LATER
61640         RET     ;END OF REAL TIME CLOCK ROUTINE
61660 ;***************************************************
61680 ;
61700 ;***************************************************
61720 ;*      REAL TIME CLOCK SET ROUTINE                *
61740 ;***************************************************
61760 CLKPRMT DEFM    'ENTER TIME (MILITARY STYLE IN 1/4 HR.
                       INCREMENTS):'
61770         DEFB    ETX
61772 EXITPT  DEFM    'YOU NOW HAVE 4 MINUTES & 15 SECONDS
                      TO LEAVE'
61774         DEFB    ETX
61780 SETCLK  CALL    VDCLS
```

```
        PUSH    HL
        LD      HL,4*64+VIDEO
        LD      (CURADD),HL
        LD      HL,CLKPRMT
        CALL    VDLINE
        POP     HL
        CALL    KBWAIT  ;DUMMY, WILL BE REPLACED BY
                KBLINE
                        ;IN MILITARY FORMAT.. DECODED TO
                NUMBER FOR (TIME)
                        ;IN PRODUCTION SYSTEM
        LD      (TIME),A;STUFF DUMMY TIME INTO (TIME)
        PUSH    HL
        LD      HL,6*64+VIDEO
        LD      (CURADD),HL
        LD      HL,EXITPT
        CALL    VDLINE
        POP     HL
        RET
;       END OF CLOCK SET ROUTINE
;*************************************************
```

The embodiments of the invention in which an exclusive property or privilege is claimed are defined as follows:

1. A method of transmitting from a transmitter which is part of a first system to a receiver which is part of a second system a message which includes a plurality of characters arranged in a predetermined sequence, comprising the step of transmitting each said character of said message in the form of a 48-bit binary word, said step of transmitting a 48-bit binary word including the steps of: transmitting serially the bits of a first 8-bit binary word which is a predetermined binary number; thereafter transmitting serially the bits of a second 8-bit binary word which is a binary number representing the position in said message of a selected one of said characters thereof; thereafter transmitting serially the bits of a third 8-bit binary word which is identical to said second 8-bit binary word; thereafter transmitting serially the bits of a fourth 8-bit binary word which is a binary number representing said selected character; thereafter transmitting serially the bits of a fifth 8-bit binary word which is identical to said fourth 8-bit binary word; and thereafter transmitting serially a sixth 8-bit binary word which is a predetermined binary number different from said predetermined binary number sent as said first 8-bit binary word.

2. The method according to claim 1, wherein the bits of said first 8-bit binary word are all binary 0's, and wherein the bits of said sixth 8-bit binary word are all binary 1's.

3. The method according to claim 1, wherein each of said fourth and fifth 8-bit words is the ASCII representation of said selected one of said characters.

4. The method according to claim 1, wherein the maximum number of said characters in said message is 128, and wherein said second and third 8-bit binary words are each a number between 0 and 127, inclusive.

5. The method according to claim 1, wherein the bits of each of said 8-bit binary words are transmitted serially beginning with the most significant bit thereof.

6. The method according to claim 1, including the step of transmitting all of said characters of said message in succession, and the step of repeatedly transmitting said message.

7. The method according to claim 6, including the step of transmitting a plurality of said 48-bit binary words as a continuous string of binary bits transmitted at a first rate, and the step of causing said receiver to continuously receive binary bits at a second rate slightly different from said first rate and to periodically evaluate the 48 bits most recently received to determine whether the bit pattern thereof constitutes a valid 48-bit word from said transmitter of said first system.

8. The method according to claim 1, wherein said transmitter is a radio transmitter and said receiver is a radio receiver, and wherein said step of transmitting each character of said message in the form of a 48-bit binary word includes the step of transmitting each bit of said 48-bit binary word by producing an audio frequency signal which has a first frequency if such bit is a binary 1 and has a second frequency if such bit is a binary 0, modulating said audio frequency signal to produce a radio frequency signal at a radio frequency, and thereafter transmitting said radio frequency signal from said radio transmitter to said radio receiver.

9. The method according to claim 8, wherein said radio frequency is substantially equal to the center frequency of a selected citizens band channel.

10. The method according to claim 1, including a plurality of systems which each have a radio transmitter and a radio receiver, said first and second systems each being a respective one of said plural systems.

11. The method according to claim 10, wherein each said system includes a plurality of sensors, and including the step of causing each said system to continuously monitor its sensors and to cause its transmitter to transmit said message when one of its sensors is actuated.

12. In a security system which includes plural sensors which are each adapted to detect an alarm condition, means for monitoring said sensors to determine whether or not any said sensor has detected an alarm condition, transmitting means for transmitting a message in response to detection of an alarm condition by any said sensor, receiving means for receiving a said message transmitted by a further said security system, and means for providing one of an audio and a visual indication of the receipt of said message by said receiving means, the improvement comprising wherein said message is a plurality of characters arranged in a predetermined sequence, and wherein said transmitting means includes means for transmitting said message as a plurality of successive 48-bit binary words, the bits of each said 48-bit word being sent serially, and each said 48-bit word including a first 8-bit binary word which is a predetermined binary number, a second 8-bit binary word which is transmitted after said first 8-bit binary word and is a binary number representing the position in said message of a selected one of said characters thereof, a third 8-bit binary word which is transmitted after and is identical to said second 8-bit binary word, a fourth 8-bit binary word which is transmitted after said third 8-bit binary word and is a binary number representing said selected character of said message, a fifth 8-bit binary word which is transmitted after and is identical to said fourth 8-bit binary word, and a sixth 8-bit binary word which is transmitted after said fifth 8-bit binary word and is a predetermined binary number different from said predetermined binary number sent as said first 8-bit binary word.

13. The security system according to claim 12, wherein said transmitting means transmits a plurality of said 48-bit binary words as a continuous string of binary bits transmitted at a first rate, and wherein said receiving means continuously receives binary bits at a second rate slightly different from said first rate and periodically evaluates the 48 bits most recently received to determine whether the bit pattern thereof constitutes a valid 48-bit word from a said transmitting means.

14. The security system according to claim 12, wherein said transmitting means includes a radio transmitter and said receiving means includes a radio receiver, and wherein said transmitting means transmits each bit of said 48-bit binary word by producing an audio frequency signal which has a first frequency if such bit is a binary 1 and has a second frequency if such bit is a binary 0, thereafter modulating said audio frequency signal to produce a radio frequency signal at a radio frequency, and thereafter transmitting said radio frequency signal.

15. The security system according to claim 12, wherein said means for monitoring said sensors includes a register having at least six bits, a three-to-eight decoder having three select inputs and eight data outputs, and an eight-to-one selector having three select inputs, eight data inputs and a data output, said sensors each being connected between a respective pair of said data outputs of said three-to-eight decoder and said data inputs of said eight-to-one selector, three bits of said register being connected to said select inputs of said three-to-eight decoder and three further bits of said register being connected to said select inputs of said eight-to-one selector, said security system having means for loading into said register a binary number corresponding to a selected one of said sensors, the status of said selected sensor thereafter appearing at said data output of said eight-to-one selector and said security system including means for sensing the condition of said data output of said eight-to-one selector.

16. In a security system which includes plural sensors which are each adapted to detect an alarm condition, means for monitoring said sensors to determine whether or not any said sensor has detected an alarm condition, transmitting means for transmitting a message in response to detection of an alarm condition by any said sensor, receiving means for receiving a said message transmitted by a further said security system, and means for providing one of an audio and a visual indication of the receipt of said message by said receiving means, the improvement comprising: a temperature sensor; selectively actuable temperature adjustable means for effecting a change in the temperature of the air in the region of said temperature sensor; and control means responsive to said temperature sensor for selectively actuating said temperature control means to cause the air temperature in the region of said temperature sensor to substantially conform to a predetermined temperature characteristic; wherein said predetermined temperature characteristic specifies a predetermined variation of temperature with respect to time; and wherein said control means includes a keyboard, a visual display, means for displaying said predetermined temperature characteristic on said display on a graph of time versus temperature, and means responsive to manual actuation of keys on said keyboard for facilitating alteration of said predetermined temperature characteristic displayed on said display.

17. The security system according to claim 16, including a plurality of said temperature sensors, a plurality of said temperature adjusting means which are each associated with a respective said temperature sensor, and a plurality of said predetermined temperature characteristics, said control means being responsive to each said temperature sensor and controlling each said temperature adjusting means in response to the associated temperature sensor according to a respective said predetermined temperature characteristic.

18. The security system of claim 16, wherein said graph on said display has a vertical axis representing temperature in degrees Fahrenheit and a horizontal axis representing time.

19. The security system of claim 18, wherein said predetermined temperature characteristic is displayed as a curve having a plurality of segments which each represent a fifteen minute interval of time, each said segment of said curve being adjustable vertically on said graph in increments of 1° Fahrenheit.

20. A method of transmitting from a transmitter which is part of a first system to a receiver which is part of a second system a message which includes a plurality of characters arranged in a predetermined sequence, comprising the step of transmitting each said character of said message in the form of a binary word, said step of transmitting said binary word including the steps of: transmitting serially the bits of a first portion of said binary word which is a predetermined binary number; thereafter transmitting serially the bits of successive second, third, fourth and fifth portions of said binary word, two of said second, third, fourth and fifth portions being identical binary numbers representing the position in said message of a selected one of said characters thereof, and the other two of said second, third, fourth and fifth portions being identical binary numbers representing said selected character; and thereafter transmitting serially a sixth portion of said binary word which is a predetermined binary number different from said predetermined binary number sent as said first portion of said binary word.

21. In an apparatus which includes a first system having a transmitter, a second system having a receiver, and means for transmitting from said transmitter of said first system to said receiver of said second system a message which includes a plurality of characters arranged in a predetermined sequence, the improvement comprising means for transmitting each said character of said message in the form of a binary word, the bits of each said binary word being sent serially, and each said binary word including: a first portion which is a predetermined binary number; second, third, fourth and fifth portions which are successively transmitted after said first portion, two of said second, third, fourth and fifth portions being identical binary numbers representing the position in said message of a selected one of said characters thereof, and the other two of said second, third, fourth and fifth portions being identical binary numbers representing said selected character of said message; and a sixth portion which is transmitted after said fifth portion and is a predetermined binary number different from said predetermined binary number sent as said first portion.

22. The apparatus according to claim 21, wherein one of said first and second systems includes: a temperature sensor; selectively actuable temperature adjusting means for effecting a change in the temperature of the air in the region of said temperature sensor; and control means responsive to said temperature sensor for selectively actuating said temperature control means to cause the air temperature in the region of said temperature sensor to substantially conform to a predetermined temperature characteristic.

* * * * *